US011264515B2

(12) United States Patent
Karino

(10) Patent No.: US 11,264,515 B2
(45) Date of Patent: Mar. 1, 2022

(54) RESISTOR ELEMENT

(71) Applicant: FUJI ELECTRIC CO., LTD., Kawasaki (JP)

(72) Inventor: Taichi Karino, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/660,178

(22) Filed: Oct. 22, 2019

(65) Prior Publication Data

US 2020/0203536 A1   Jun. 25, 2020

(30) Foreign Application Priority Data

Dec. 19, 2018   (JP) .............................. JP2018-237125

(51) Int. Cl.

| | |
|---|---|
| *H01L 29/8605* | (2006.01) |
| *H01L 29/06* | (2006.01) |
| *H01L 29/66* | (2006.01) |
| *H01L 27/02* | (2006.01) |
| *H01L 23/58* | (2006.01) |
| *H01L 23/00* | (2006.01) |
| *H02M 7/5387* | (2007.01) |

(Continued)

(52) U.S. Cl.

CPC ........ *H01L 29/8605* (2013.01); *H01L 23/585* (2013.01); *H01L 24/05* (2013.01); *H01L 27/0288* (2013.01); *H01L 29/0684* (2013.01); *H01L 29/417* (2013.01); *H01L 29/66166* (2013.01); *H02M 7/5387* (2013.01); *H01L 21/0262* (2013.01); *H01L 21/0274* (2013.01); *H01L 21/02271* (2013.01); *H01L 21/02532* (2013.01); *H01L 21/02595* (2013.01); *H01L 21/266* (2013.01); *H01L 21/26513* (2013.01); *H01L 21/28568* (2013.01); *H01L 21/30625* (2013.01); *H01L 21/31116* (2013.01); *H01L 21/31144* (2013.01); *H01L 2224/04042* (2013.01); *H02P 27/06* (2013.01)

(58) Field of Classification Search
CPC ............. H01L 29/8605; H01L 29/0684; H01L 29/417; H01L 23/5228; H01L 29/7816; H01L 29/405; H01L 27/0629; H01L 27/0802; H01L 28/20
See application file for complete search history.

(56) References Cited

U.S. PATENT DOCUMENTS 4,210,465 A * 7/1980 Brower ................. H01L 21/033
257/375
5,640,036 A * 6/1997 Lee ......................... H01L 23/60
257/355

(Continued)

FOREIGN PATENT DOCUMENTS

JP          8-306861 A      11/1996

*Primary Examiner* — Bitew A Dinke

(57) ABSTRACT

A resistor element encompasses a first resistive layer, a first protection strip implemented by a tandem connection of p-n junctions, an interlayer insulating film covering the first resistive layer and the first protection strip, a first external electrode on the interlayer insulating film, being connected to a terminal of the first resistive layer and a terminal of the first protection strip, and a second external electrode on the interlayer insulating film, being connected to another terminal of the first resistive layer and another terminal of the first protection strip.

18 Claims, 24 Drawing Sheets

(51) Int. Cl.
*H01L 29/417* (2006.01)
*H02P 27/06* (2006.01)
*H01L 21/02* (2006.01)
*H01L 21/027* (2006.01)
*H01L 21/311* (2006.01)
*H01L 21/266* (2006.01)
*H01L 21/265* (2006.01)
*H01L 21/285* (2006.01)
*H01L 21/306* (2006.01)

(56) References Cited

U.S. PATENT DOCUMENTS

| | | | | |
|---|---|---|---|---|
| 5,726,474 | A * | 3/1998 | Miller | H01L 29/4238 257/364 |
| 5,973,359 | A * | 10/1999 | Kobayashi | H01L 27/0251 257/328 |
| 6,084,255 | A * | 7/2000 | Ueda | H01L 27/0207 257/204 |
| 6,320,241 | B1 * | 11/2001 | Okamoto | H01L 27/0629 257/528 |
| 7,306,999 | B2 * | 12/2007 | Hall | H03K 17/102 438/329 |
| 10,312,343 | B2 * | 6/2019 | Miyazawa | H01L 29/7395 |
| 10,388,717 | B2 * | 8/2019 | Saito | H01L 27/0802 |
| 10,483,347 | B2 * | 11/2019 | Karino | H01L 29/1066 |
| 10,727,180 | B2 * | 7/2020 | Karino | H01L 28/24 |
| 2001/0048122 | A1 * | 12/2001 | Tada | H01L 29/405 257/240 |
| 2010/0164068 | A1 * | 7/2010 | Pennock | H01L 29/861 257/538 |
| 2012/0091529 | A1 * | 4/2012 | Cheng | H01L 23/5228 257/360 |
| 2012/0154026 | A1 * | 6/2012 | Karino | G05F 1/462 327/543 |
| 2014/0054746 | A1 * | 2/2014 | Ohtake | H01L 23/5228 257/536 |
| 2015/0001677 | A1 * | 1/2015 | Palumbo | H01L 29/405 257/536 |
| 2016/0133704 | A1 * | 5/2016 | Karino | H01L 29/808 257/272 |
| 2016/0276425 | A1 * | 9/2016 | Saito | H01L 23/5228 |
| 2017/0207296 | A1 * | 7/2017 | Karino | H01L 28/20 |
| 2017/0263598 | A1 * | 9/2017 | Arai | H01L 29/87 |
| 2017/0309564 | A1 * | 10/2017 | Ishii | H01L 23/5228 |
| 2019/0181089 | A1 * | 6/2019 | Karino | H01L 28/26 |
| 2019/0181216 | A1 * | 6/2019 | Saito | H01L 21/822 |
| 2020/0044011 | A1 * | 2/2020 | Saito | H01L 28/24 |
| 2020/0051874 | A1 * | 2/2020 | Sasaki | H01L 22/32 |
| 2020/0191857 | A1 * | 6/2020 | Karino | H01L 24/06 |
| 2020/0395151 | A1 * | 12/2020 | Karino | H01C 7/00 |
| 2020/0395355 | A1 * | 12/2020 | Nagai | H01L 24/05 |

* cited by examiner

RESISTOR ELEMENT

CROSS REFERENCE TO RELATED APPLICATIONS

This application is based upon and claims the benefit of priority from the prior Japanese Patent Application No. P2018-237125 filed on Dec. 19, 2018, the entire contents of which are incorporated herein by reference.

BACKGROUND OF THE INVENTION

1. Field of the Invention

The present invention relates to a resistor element.

2. Description of the Related Art

As a semiconductor element used for a semiconductor integrated circuit (IC) or the like, a resistor element implemented by a resistive layer of a thin film, such as a polycrystalline silicon (polysilicon), is known (see JP H8-306861A). In the resistor element described in JP H8-306861A, two electrodes are connected to both ends of the resistive layer on an upper surface side of the resistive layer, and bonding wires are respectively bonded to the two electrodes. Further, by expanding the area of the resistive layer, heat generated in the resistive layer is dissipated to the lower layer. Therefore, a chip size is increased, and two bonding wires are required.

Therefore, a vertical resistor element, in which an end of the resistive layer is connected to an electrode on the upper surface side of the resistive layer, and the other end of the resistive layer is ohmically connected to the semiconductor substrate through a transfer interconnection, may be adopted. By using the vertical resistor element, it is possible to reduce the chip size more than a horizontal resistor element, and to reduce a number of bonding wires connected to the electrodes.

In order to prevent an increase in resistance value when the resistor element is operated at high temperature, a negative temperature coefficient of 0 ppm/° C. or less is preferable. The resistive layer of the resistor element is achieved by doping impurity elements into the polysilicon layer. The temperature coefficient of the resistor element can be controlled by adjusting a dose amount and acceleration voltage of impurity ions to be implanted into the polysilicon layer, and by adjusting temperature and time of activation annealing of the implanted impurity ions. The resistance value of the resistor element is controlled by adjusting a length and width of the resistive layer, assuming a thickness of the resistive layer is constant.

When a resistivity of the resistor element is constant, the width of the resistive layer may be decreased to increase the resistance value. As the width of the resistive layer decreases, a current density due to a surge such as electrostatic discharge (ESD) applied to the electrodes of the resistor element increases. Therefore, the resistor element is damaged due to heat generation, and the reliability is deteriorated.

SUMMARY OF THE INVENTION

An aspect of the present invention inheres in a resistor element, including: (a) a lower-layer insulating-film; (b) a rectangular first resistive layer defined by first and second sidewalls, disposed on the lower-layer insulating-film; (c) a first protection strip on the lower-layer insulating-film in parallel with the first sidewall of the first resistive layer, implemented by a tandem connection of a plurality of p-n junctions, the tandem connection includes alternate arrangements of a first-polarity zone of a first conductivity type and a second-polarity zone of a second conductivity type; (d) an interlayer insulating film covering the first resistive layer and the first protection strip; (e) a first external electrode on the interlayer insulating film, being connected to a terminal of the first resistive layer and a terminal of the first protection strip, respectively; and (f) a second external electrode on the interlayer insulating film, being connected to another terminal of the first resistive layer and another terminal of the first protection strip, respectively.

Another aspect of the present invention inheres in a resistor element, including: (a) a semiconductor substrate; (b) a lower-layer insulating-film on a top surface of the semiconductor substrate; (c) a rectangular first resistive layer defined by first and second sidewalls, disposed on the lower-layer insulating-film; (d) a first protection strip on the lower-layer insulating-film in parallel with the first sidewall of the first resistive layer, implemented by a tandem connection of a plurality of p-n junctions, the tandem connection includes alternate arrangements of a first-polarity zone of a first conductivity type and a second-polarity zone of a second conductivity type; (e) an interlayer insulating film covering the first resistive layer and the first protection strip; (f) a first external electrode on the interlayer insulating film, being connected to a terminal of the first resistive layer and a terminal of the first protection strip, respectively; (g) an intermediate-connecter on the interlayer insulating film, being connected to another terminal of the first resistive layer and another terminal of the first protection strip, respectively, the intermediate-connecter is ohmically connected to the semiconductor substrate through a window portion of the lower-layer insulating-film; and (h) a counter electrode on a bottom surface of the semiconductor substrate.

DETAILED DESCRIPTION

Figure 1:
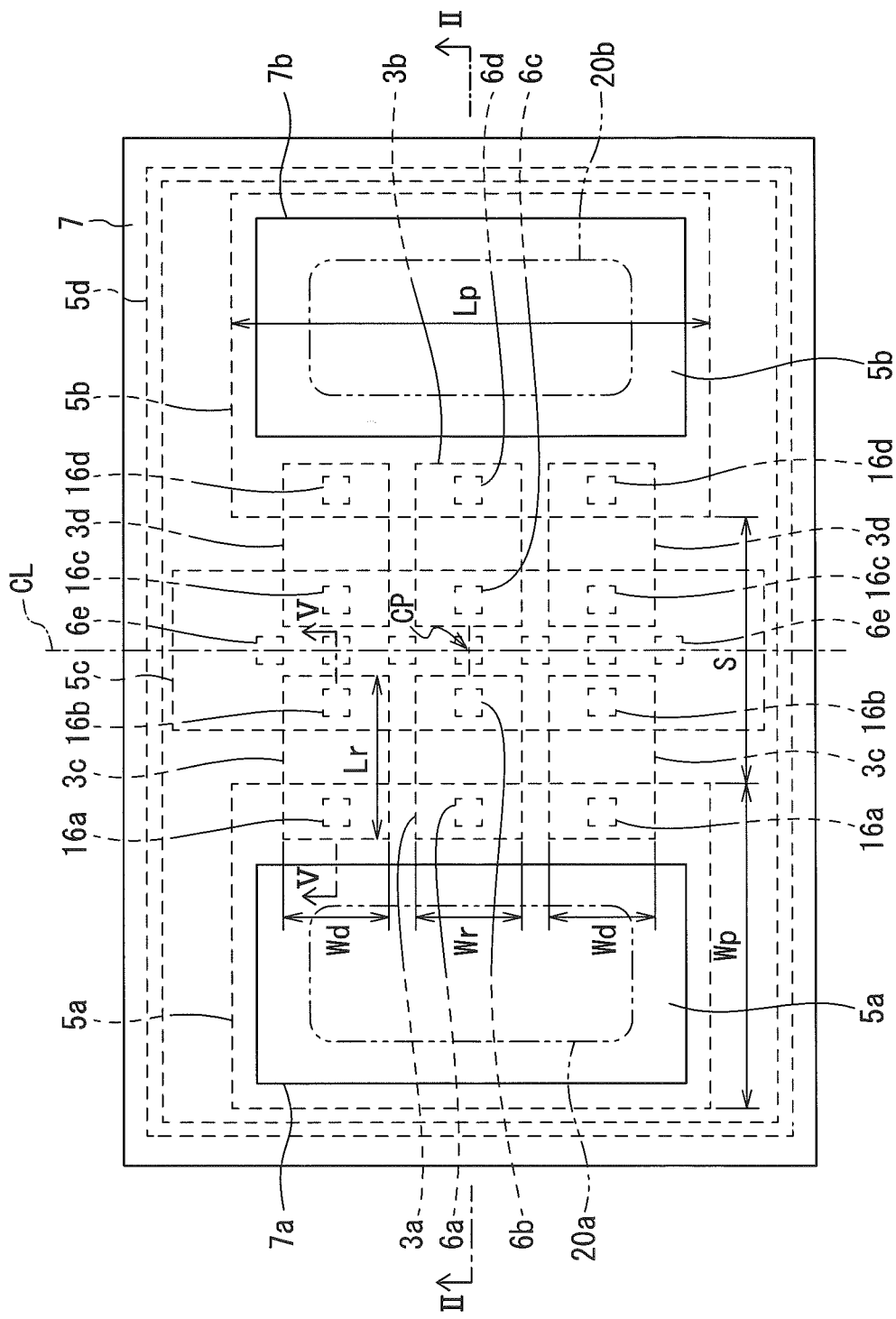
FIG. 1 is a schematic plan view illustrating an example of a resistor element according to an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top".

In the following descriptions, the case where a first conductivity type is n-type and a second conductivity type is p-type will be exemplarily described. However, it is also possible to select the conductivity type in an inverse relationship so that the first conductivity type is p-type and the second conductivity type is n-type. In addition, the superscript "+" or "−" added to the mark "n" or "p" denotes that a semiconductor region has relatively high or low impurity concentration as compared with a region without the superscript "+" or "−" added. It should be noted that semiconductor regions denoted by the same mark, such as "n", do not necessarily have exactly the same impurity concentration.

Embodiment

<Resistor Element>

Figure 2:
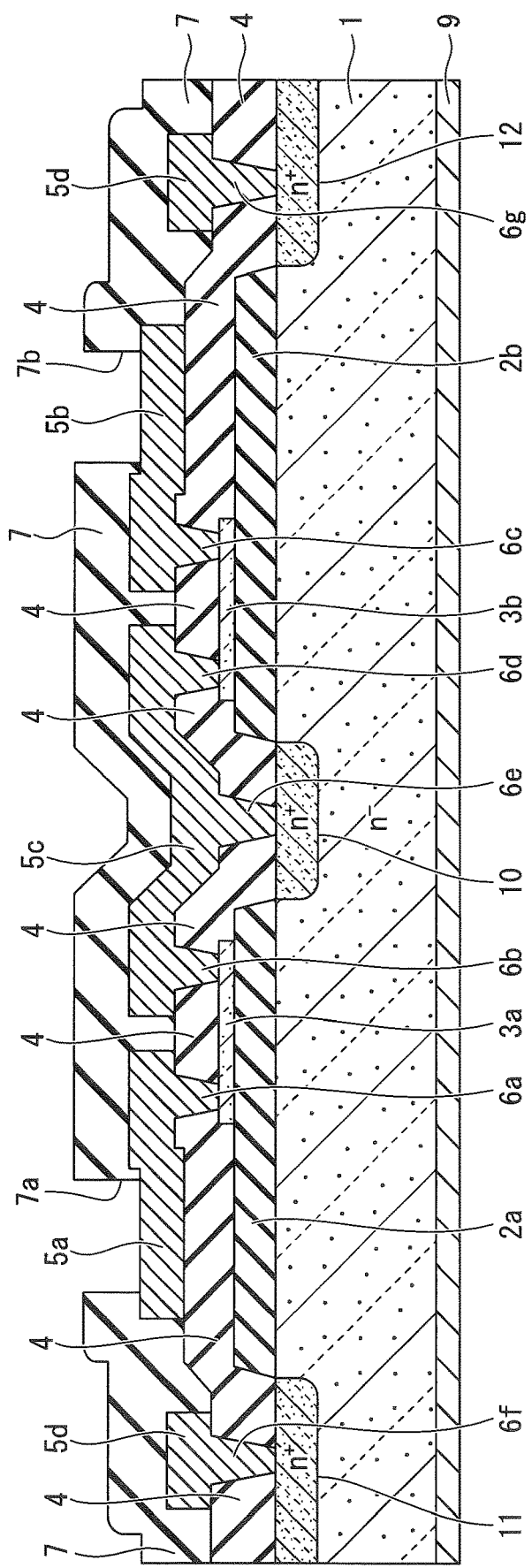
FIG. 2 is a schematic cross-sectional view of the resistor element taken along line II-II of FIG. 1.

A resistor element according to an embodiment of the present invention, as illustrated in FIGS. 1 and 2, includes a pair of a first external electrode 5a and a second external electrode 5b and an intermediate-connecter 5c electrically connecting the first external electrode 5a and the second external electrode 5b. The intermediate-connecter 5c is disposed between the first external electrode 5a and the second external electrode 5b as a planar pattern, and each of the first external electrode 5a, the second external electrode 5b and the intermediate-connecter 5c has a rectangular planar pattern with a short side and a long side. A direction in which the first external electrode 5a, the intermediate-connecter 5c, and the second external electrode 5b are sequentially arranged is a direction of each short side. And the first external electrode 5a, the intermediate-connecter 5c, and the second external electrode 5b are arranged so that each long side is parallel to each other. A chip size of the resistor element according to the embodiment is, for example, about 2.8 millimeters×2.5 millimeters. The first external electrode 5a disposed on the left side of FIG. 1 and the second external electrode 5b disposed on the right side of FIG. 1 have substantially similar shapes. The first external electrode 5a and the second external electrode 5b are arranged in parallel, separated from each other. For example, each of the first external electrode 5a and the second external electrode 5b is illustrated as a rectangular planar pattern having a longitudinal direction in the vertical direction of FIG. 1, and has a length Lp of about 2.0 millimeters, a width Wp of about 0.9 millimeter, an interval S of about 0.5 millimeter or more. In FIG. 1, the intermediate-connecter 5c is also illustrated as a rectangular planar pattern having a longitudinal direction in the vertical direction of FIG. 1. A guard-ring layer 5d is arranged in a ring shape on an outer peripheral portion of the chip implementing the resistor element according to the embodiment.

As can be seen from FIG. 2, a position of one end of a rectangular first resistive layer 3a overlaps with a contact plug 6a of the first external electrode 5a, and a position of the other end overlaps with a contact plug 6b of the intermediate-connecter 5c. A pair of rectangular first protection strips 3c having similar shapes are disposed in parallel to face each other, sandwiching the first resistive layer 3a in the vertical direction of FIG. 1. One end position of each of the pair of first protection strips 3c overlaps a contact plug 16a of the first external electrode 5a, and the other end position of each of the pair of first protection strips 3c overlaps a contact plug 16b of the intermediate-connecter 5c. In addition, a rectangular second resistive layer 3b is disposed such that a position of one end of the second resistive layer 3b overlaps a contact plug 6c of the second external electrode 5b and a position of the other end of the second resistive layer 3b overlaps a contact plug 6d of the intermediate-connecter 5c. A pair of rectangular second protection strips 3d having similar shapes are disposed in parallel to face each other, sandwiching the second resistive layer 3b in the vertical direction of FIG. 1. One end position of each of the pair of second protection strips 3d overlaps a contact plug 16d of the second external electrode 5b and the other end position of each of the pair of second protection strips 3d overlaps a contact plug 16c of the intermediate-connecter 5c. Each of the first resistive layer 3a and the second resistive layer 3b has a width Wr in the vertical direction of FIG. 1, and each of the first protection strips 3c and the second protection strips 3d has a width Wd in the vertical direction of FIG. 1.

As can be seen from the cross-sectional view of FIG. 2, a protective film (passivation film) 7 is disposed on the first external electrode 5a, the second external electrode 5b and the intermediate-connecter 5c. In the protective film 7, a first window 7a is provided to expose a part of an upper surface of the first external electrode 5a, and a second window 7b is provided to expose a part of an upper surface of the second external electrode 5b. As illustrated in FIG. 1, each of the first window 7a and the second window 7b has a rectangular planar pattern. For example, each length of the first window 7a and the second window 7b is about 1.9 millimeters, and each width of the first window 7a and the second window 7b is about 0.9 millimeter. The portion of the first external electrode 5a exposed from the first window 7a implements a first effective-connection area 20a to which may be joined to an external-connection means, such as a bonding wire, a bonding ribbon and the like. Similarly, the portion of the second external electrode 5b exposed from the second window 7b implements a second effective-connection area 20b which may be joined to the external-connection means. For example, each of the first effective-connection area 20a and the second effective-connection area 20b is about 1.3 millimeters×0.74 millimeter or less.

The rectangular planar pattern of the intermediate-connecter 5c is provided on a center line CL passing through a center point CP of the chip. The first resistive layer 3a, the second resistive layer 3b, the first protection strip 3c, the second protection strip 3d, the first external electrode 5a, the second external electrode 5b and the intermediate-connecter 5c are provided in the planar pattern so as to be in line symmetry with respect to the center line CL passing through the center point CP of the chip. That is, the first resistive layer 3a, the second resistive layer 3b, the first protection strip 3c, the second protection strip 3d, the first external electrode 5a, the second external electrode 5b and the intermediate-connecter 5c are in two-fold rotational symmetric with respect to the center point CP of the chip, in the planar pattern. Also, as illustrated in FIG. 1, the first window 7a and the second window 7b are similarly placed so as to be in line symmetry with respect to the center line CL passing through the center point CP in the planar pattern, and in two-fold rotational symmetry with respect to the chip center point CP. As described above, by having rotational symmetry in the planar pattern, the resistor element according to the embodiment may be used by being rotated 180 degrees at the time of mounting, and the degree of freedom of arrangement at the time of assembly work is increased.

FIG. 2 is a cross-sectional view focusing on the areas of the first resistive layer 3a and the second resistive layer 3b illustrated in FIG. 1. The resistor element according to the embodiment includes, as illustrated in FIG. 2, a semiconductor substrate 1 of the first conductivity type (n$^-$-type), lower-layer insulating-films 2a, 2b, the first resistive layer 3a and the second resistive layer 3b. The lower-layer insulating-films 2a, 2b are disposed on the semiconductor substrate 1. The first resistive layer 3a and the second resistive layer 3b, which are thin films, are disposed on the lower-layer insulating-films 2a, 2b. The resistor element according to the embodiment is applied as a gate resistance of a main semiconductor element implemented by an insulated gate semiconductor element, such as an insulated gate bipolar transistor (IGBT), a MIS transistor and the like. Although depending on specifications required as a resistor element, the thickness of the semiconductor substrate 1 is, for example, about 250 micrometers to 450 micrometers, and the resistivity of the semiconductor substrate 1 is usually selected to be a relatively low value. For example, a silicon (Si) substrate or the like can be used as the semiconductor substrate 1.

In the cross-sectional view of FIG. 2, different reference numerals are given as the lower-layer insulating-films 2a, 2b, but the lower-layer insulating-films 2a, 2b may be a single film (2a, 2b), which is continuous in the back of the paper surface or the like. In an upper portion of the semiconductor substrate 1, a contact region 10 of the first conductivity type (n$^+$-type) having a lower resistivity than the semiconductor substrate 1 is provided between the lower-layer insulating-films 2a, 2b. When the lower-layer insulating-films 2a, 2b are formed as the continuous single film, a contact plug 6e of the intermediate-connecter 5c is connected to the contact region 10 through a window provided in the lower-layer insulating-films 2a, 2b. In addition, when using the semiconductor substrate 1 of the second conductivity type (p$^-$-type), the semiconductor region of the second conductivity type (p$^+$-type) having a lower resistivity than that of the semiconductor substrate 1 is buried in the semiconductor substrate 1 as the contact region 10.

The lower-layer insulating-films 2a, 2b may be a field insulating film having a thickness, for example, of about 600 nanometers to about 1000 nanometers. For the lower-layer insulating-films 2a, 2b, a silicon oxide ($SiO_2$) film, a silicon nitride ($Si_3N_4$) film, or a composite film of the $SiO_2$ film and the $Si_3N_4$ film may be used. The lower-layer insulating-films 2a, 2b may be insulating films by chemical vapor deposition (CVD) or the like using an organosilicon compound gas, such as a tetraethoxysilane (TEOS) gas and the like. A parasitic capacitance can be decreased by thickening the lower-layer insulating-films 2a, 2b.

Thicknesses of the first resistive layer 3a and the second resistive layer 3b are, for example, about 400 nanometers to about 600 nanometers, and sheet resistances of the first resistive layer 3a and the second resistive layer 3b are, for example, about 100 ohms per square to about 200 ohms per square. A resistance value of the first resistive layer 3a may be controlled by adjusting the thickness of the first resistive layer 3a, the width Wr of the first resistive layer 3a, in the vertical direction of FIG. 1, a length Lr of the first resistive layer 3a, in the left and right direction of FIG. 1, and a material of the first resistive layer 3a. Similarly, a resistance value of the second resistive layer 3b may be controlled by adjusting the thickness of the second resistive layer 3b, the width Wr of the second resistive layer 3b, a length Lr of the second resistive layer 3b and a material of the second resistive layer 3b. For each material of the first resistive layer 3a and the second resistive layer 3b, for example, polycrystalline silicon doped with an n-type impurity, that is, doped polysilicon (DOPOS) film can be used. The n-type DOPOS film may be heavily doped by impurity elements, such as phosphorus (P) atoms, boron (B) atoms and the like, to polysilicon film by ion implantation, or by depositing polysilicon film by CVD while adding the impurity elements from the gas phase using doping gas. It is possible to control each resistance value of the first resistive layer 3a and the second resistive layer 3b by adjusting the doping amount of the impurity elements into the DOPOS film to change the resistivity of DOPOS film.

Preferably, the temperature coefficient of the first resistive layer 3a is 0 ppm per degree Celsius or less, that is, the temperature coefficient of the first resistive layer 3a is 0, or the first resistive layer 3a has a negative temperature coefficient. Similarly, preferably, the temperature coefficient of the second resistive layer 3b is 0 ppm per degree Celsius or less, that is, the temperature coefficient of the second resistive layer 3b is 0, or the second resistive layer 3b has the negative temperature coefficient. By selecting the temperature coefficient, it is possible to prevent an increase in the resistance value at high temperature operation. For example, when the resistor element according to the embodiment is applied to the gate resistance of the IGBT, it is possible to prevent a loss when the IGBT is on-state. The temperature coefficient of DOPOS film can be controlled by adjusting the dose amount when ion-implanting the impurity atoms into the polysilicon film. For example, when the dose amount is about $7.0 \times 10^{15}$ per centimeter square or less, the temperature coefficient of DOPOS film may be 0 ppm per degree Celsius or less. The temperature coefficients of the first resistive layer 3a and the second resistive layer 3b are not necessarily limited to 0 ppm per degree Celsius or less, and the first resistive layer 3a and the second resistive layer 3b may have a positive temperature coefficient.

The first resistive layer 3a and the second resistive layer 3b are not limited to the DOPOS film, and a transition-metal-nitride film, such as tantalum nitride ($TaN_x$), or a multi-layer film of refractory metals of sequentially laminated chromium (Cr)-nickel (Ni)-manganese (Mn), may be used. Alternatively, for the first resistive layer 3a and the second resistive layer 3b, a thin film, such as a silver palladium (AgPd) film, a ruthenium oxide ($RuO_2$) or the like, may be used. Although different from the structure illustrated in FIG. 2, it is also possible to achieve realize each of the first resistive layer 3a and the second resistive layer 3b by a p-type impurity-diffused layer or an n-type impurity-diffused layer buried in a surface of the semiconductor layer.

An interlayer insulating film 4 covers the lower-layer insulating-films 2a, 2b and the first and second resistive layers 3a, 3b. A thickness of the interlayer insulating film 4 is, for example, about 1000 nanometers to about 2000 nanometers. For the interlayer insulating film 4, a silicon oxide ($SiO_2$) film containing no impurity, called a "NSG film", a silicon oxide film in which atoms of phosphorus are doped, that is, a phosphor-silicate glass (PSG) film, a silicon oxide film in which atoms of boron are doped, that is, a boro-silicate glass (BSG) film and the like may be used. Furthermore, a single layer film of a silicon oxide film in which atoms of phosphorus and boron are doped, that is, a boro-phospho-silicate glass (BPSG) film or a silicon nitride film ($Si_3N_4$ film), or a composite film in which two or more of the above-mentioned films are selected and combined, may be also adopted as the interlayer insulating film 4. For example, the interlayer insulating film 4 may be made of a composite film in which the NSG film of about 500 nanometers to about 800 nanometers and the PSG film of about 400 nanometers to about 800 nanometers are laminated. The NSG film has a function of decreasing the resistance variation. In addition, the PSG film has a function of securing the strength of wire bonding.

On the interlayer insulating film 4, a first external electrode 5a, a second external electrode 5b and an intermediate-connecter 5c are disposed. The first external electrode 5a is located above the lower-layer insulating-film 2a, and a horizontal position of an end of the first external electrode 5a overlaps with one end of the first resistive layer 3a in the depth direction. The second external electrode 5b is located above the lower-layer insulating-film 2b and a horizontal position of an end of the second external electrode 5b overlaps with one end of the second resistive layer 3b in the depth direction. The intermediate-connecter 5c is arranged so that the cross-sectional structure illustrated in FIG. 2 is approximately T-shaped from above the lower-layer insulating-film 2a to above the lower-layer insulating-film 2b to be sandwiched between the first external electrode 5a and the second external electrode 5b.

The first external electrode 5a is connected to one end of the first resistive layer 3a via the contact plug 6a. The other end of the first resistive layer 3a is connected to one resistive-layer-connection terminal, which is one end of the intermediate-connecter 5c, via the contact plug 6b. The second external electrode 5b is connected to one end of the second resistive layer 3b via the contact plug 6c. The other end of the second resistive layer 3b is connected to the other resistive-layer-connection terminal, which is the other end of the intermediate-connecter 5c, via the contact plug 6d. The substrate-connection terminal, which is the central portion of the T-shaped intermediate-connecter 5c, is ohmically connected to the $n^+$-type contact region 10 provided on the top of the semiconductor substrate 1, via the contact plug 6e with low contact resistance. A counter electrode 9 is provided on a bottom surface of the semiconductor substrate 1. That is, the first resistive layer 3a and the second resistive layer 3b are connected in parallel to the semiconductor substrate 1 via the intermediate-connecter 5c, respectively, and the vertical resistor element, which has resistors between the first external electrode 5a and the counter electrode 9, and between the second external electrode 5b and the counter electrode 9, is achieved.

Thicknesses of the first external electrode 5a, the second external electrode 5b and the intermediate-connecter 5c are, for example, about 3 micrometers. Each of the first external electrode 5a, the second external electrode 5b and the intermediate-connecter 5c is formed from a laminated film of, for example, titanium/titanium nitride (Ti/TiN) film as a barrier metal of about 100 nanometers to about 130 nanometers, aluminum-silicon (Al—Si) film of about 3 micrometers, and TiN/Ti film as an antireflection film of about 35 nanometers to about 55 nanometers. Instead of Al—Si, Al or an Al alloy, such as Al—Cu—Si, Al—Cu and the like, may be used. Each of the first external electrode 5a and the second external electrode 5b may implement an electrode pad for an output or mounting. An external connection wiring, such as a bonding wire made of Al wire and the like, having a diameter of about 200 micrometers to about 400 micrometers, is connected to the first external electrode 5a and the second external electrode 5b.

Furthermore, a guard-ring layer 5d is disposed on the interlayer insulating film 4. The guard-ring layer 5d is made of the same material as the first external electrode 5a, the second external electrode 5b and the intermediate-connecter 5c. The guard-ring layer 5d is, for example, disposed in a ring shape on the outer peripheral portion of the chip implementing the resistor element according to the embodiment. The guard-ring layer 5d is ohmically connected to the semiconductor substrate 1 via $n^+$-type contact regions 11, 12 provided on the upper portion of the semiconductor substrate 1. The guard-ring layer 5d has a function of preventing moisture from entering from the side surface of the chip.

As illustrated in FIG. 2, a protective film 7 is disposed on the first external electrode 5a, the second external electrode 5b, the intermediate-connecter 5c, and the guard-ring layer 5d. The protective film 7 may be formed from, for example, a composite film in which a TEOS film, a $Si_3N_4$ film, and a polyimide film are laminated. The protective film 7 is provided with a first window 7a and a second window 7b. A portion of the first external electrode 5a exposed from the first window 7a serves as a mounting pad to which a bonding wire may be connected. Similarly, a portion of the second external electrode 5b exposed from the second window 7b serves as a mounting pad to which a bonding wire may be connected.

As illustrated in FIG. 2, the counter electrode 9 is disposed on the bottom surface of the semiconductor substrate 1. The counter electrode 9 may be formed from, for example, a single layer film made of gold (Au) or a metal film laminated in the order of titanium (Ti), nickel (Ni), and gold (Au). The outermost layer of the counter electrode 9 may be made of a solderable material. The counter electrode 9 is fixed to a metal plate or the like by soldering or the like.

Figure 3:
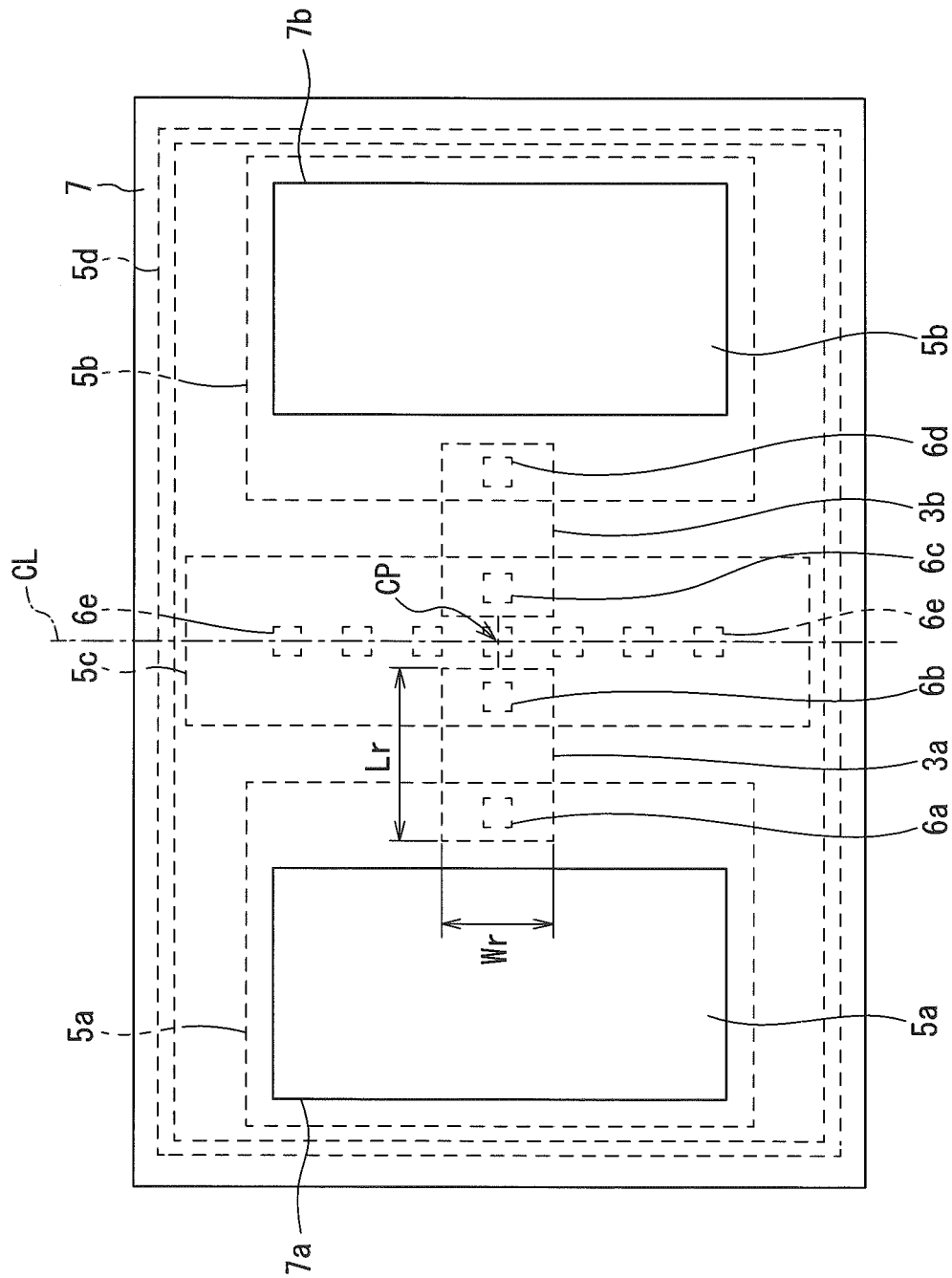
FIG. 3 is a schematic plan view illustrating an example of an earlier resistor element.

FIG. 3 illustrates a plan view of an earlier resistor element. The cross section of the earlier resistor element along the line from the contact plug 6a to the contact plug 6d in FIG. 3 corresponds to the cross section illustrated in FIG. 2. As illustrated in FIG. 3, the earlier resistor element has the first resistive layer 3a and the second resistive layer 3b, but the pair of first protection strips 3c and the pair of second protection strips 3d illustrated in FIG. 1 are not included. The resistance value of the resistor element can be controlled by adjusting the length Lr, the width Wr and the thickness of the resistive layer. In order to increase the resistance value of the resistor element, in each of the first resistive layer 3a and the second resistive layer 3b, the length Lr may be increased, the width Wr may be decreased, or the thickness may be reduced. It is not preferable to reduce the thicknesses of the first resistive layer 3a and the second resistive layer 3b, because of involving changes in the manufacturing process. In addition, when each length Lr of the first resistive layer 3a and the second resistive layer 3b is increased, the chip size is increased. Therefore, each width Wr of the first resistive layer 3a and the second resistive layer 3b is decreased to adjust the resistance value.

Figure 4:
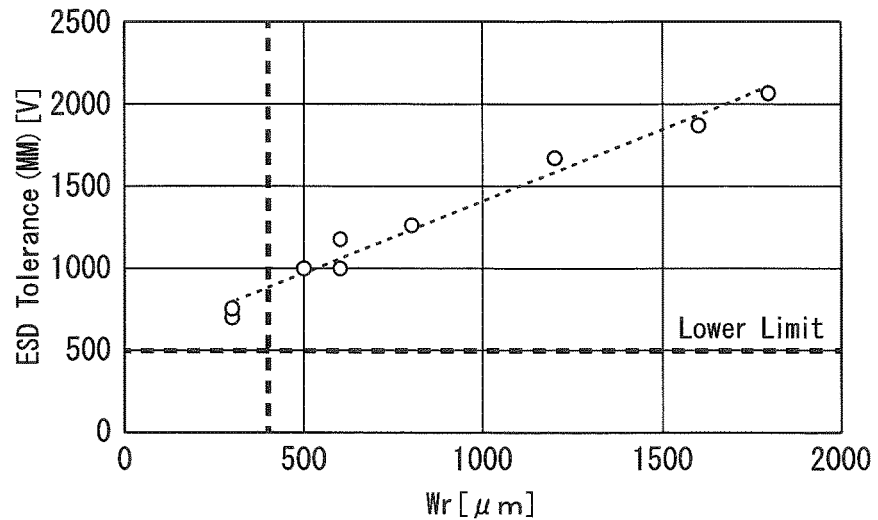
FIG. 4 is a graph illustrating a relationship between a width of the resistor element and an ESD tolerance in the MM test.

FIG. 4 illustrates the relationship between ESD tolerance of the resistor element and the width Wr of the resistive layer by a machine model (MM) test. As illustrated in FIG. 4, when a lower-limit criterion of the ESD tolerance is 500 volts, each width Wr of the first resistive layer 3a and the second resistive layer 3b needs to be 400 micrometers or more. As described above, in the earlier resistor element, when each width Wr of the first resistive layer 3a and the second resistive layer 3b is 400 micrometers or less in order to increase the resistance value of the resistor element, there is no margin with respect to the lower-limit criterion value 500 volts of the ESD tolerance. Therefore, the current density due to the ESD surge current applied to the resistor element is increased, and the resistor element may be damaged due to heat generation.

Figure 5:
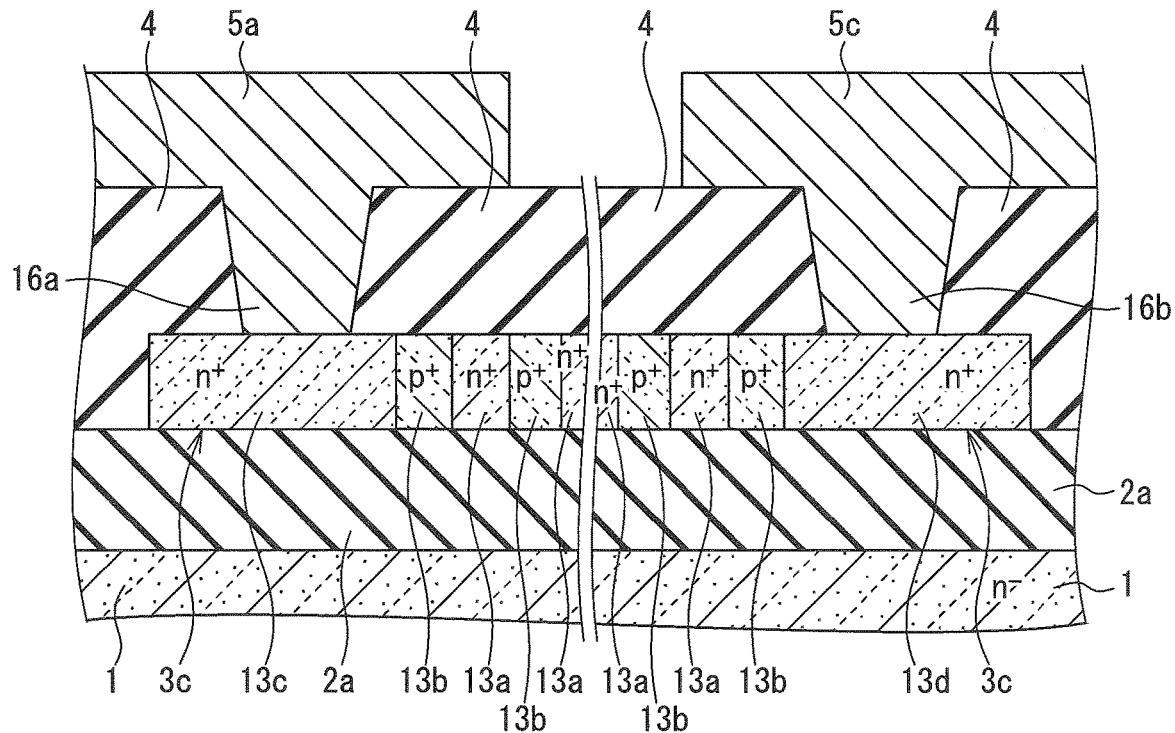
FIG. 5 is a schematic view illustrating an enlarged cross section taken along line V-V which is a part of the resistor element of FIG. 1.
Figure 6:
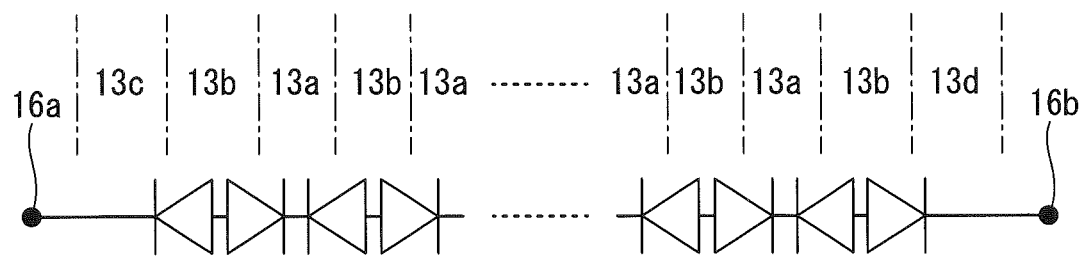
FIG. 6 is an equivalent circuit diagram of a protection strip for a resistive layer of the resistor element according to the embodiment of the present invention.

FIG. 5 illustrates an enlarged cross section taken along the line V-V, which cuts the first protection strip 3c on the upper side of the paper, or the one of the pair of the first protection strips 3c, which are a part of the resistor element according to the embodiment illustrated in FIG. 1. As illustrated in the partially enlarged view of FIG. 5, the first protection strip 3c of the resistor element according to the embodiment is provided on the lower-layer insulating-film 2a, and the interlayer insulating film 4 covers partially on the first protection strip 3c. The first protection strip 3c has a plurality of first-polarity zones 13a, or cathodes 13a of $n^+$-type, a plurality of second-polarity zones 13b, or anodes 13b of $p^+$-type, and a pair of contact region 13c of $n^|$-type and a contact region 13d of $n^|$-type. An alternately repeated structure of the $n^+$-type cathodes 13a and the $p^+$-type anodes 13b is provided between the pair of the contact region 13c and the contact region 13d. That is, the pair of the contact region 13c and the contact region 13d are disposed at both ends of the first protection strip 3c in the left-right direction of FIG. 5. One contact region 13c disposed at the left end, or one end, is electrically connected to the contact plug 16a of the first external electrode 5a. The other contact region 13d disposed at the right end, or the other end, is electrically connected to the contact plug 16b of the intermediate-connecter 5c. Thus, as illustrated in FIG. 6, the $n^+$-type contact regions 13c and 13d, the plurality of $n^+$-type first-polarity zones 13a, and the plurality of $p^|$-type second-polarity zones 13b, the $n^|$-type first-polarity zone 13a and the $p^+$-type second-polarity zone 13b are alternately repeated so as to implement a tandem connection of a plurality of p-n junctions. In the tandem connection, the polarities of the p-n junctions are alternately reversed.

In addition, although the illustration is omitted, the lower-side first protection strip 3c illustrated in the lower-side of FIG. 1, or in the other-side of the paper illustrating FIG. 1, shall have a similar configuration as the configuration of the upper-side first protection strip 3c illustrated in FIG. 5. The pair of the second protection strips 3d illustrated in FIG. 1 also have the same configuration as the first protection strip 3c illustrated in FIG. 5. That is, similarly, in the lower-side of FIG. 1, or in the other-side of FIG. 1, the interlayer insulating film 4 covers the first protection strip 3c and the pair of the second protection strips 3d, which are disposed on the lower-layer insulating-film 2b. The second protection strip 3d has a periodic structure implemented by the $n^+$-type first-polarity zones 13a, or the $n^+$-type cathodes 13a, and the $p^+$-type second-polarity zones 13b, or the $p^+$-type anodes 13b, between the pair of the $n^|$-type contact region 13c and the $n^|$-type contact region 13d. The contact region 13c and the contact region 13d are disposed at both ends of the second protection strip 3d in the left-right direction of FIG. 1. The contact region 13c disposed at one end is electrically connected to the contact plug 16d of the second external electrode 5b. The contact region 13d disposed at the other end is electrically connected to the contact plug 16c of the intermediate-connecter 5c. Thus, a plurality of p-n junctions, in which the polarities of p-n junctions are alternately reversed, are established by the $n^+$-type contact regions 13c, the plurality of $n^+$-type first-polarity zones 13a, the plurality of $p^+$-type second-polarity zones 13b and the $n^+$-type contact region 13d.

For each material of the first protection strip 3c and the second protection strip 3d, similar to the first resistive layer 3a and the second resistive layer 3b, DOPOS films having a thickness of about 400 nanometers to about 600 nanometers may be used. As each of the contact region 13c and the $n^+$-type first-polarity zones 13a of the first protection strip 3c and the second protection strip 3d, a plurality of stripes, or a plurality of zones of DOPOS film may be defined by selective doping, for example, by implanting n-type impurity ions, such as phosphorus (P) ions, arsenic (As) ions and the like, into to a polysilicon film. As each of the $p^+$-type second-polarity zones 13b, a plurality of stripes, or a plurality of zones of a DOPOS film may be selectively defined, for example, by implanting p-type impurity ions, such as boron (B) ions, aluminum (Al) ions and the like, to a polysilicon film.

Figure 7:
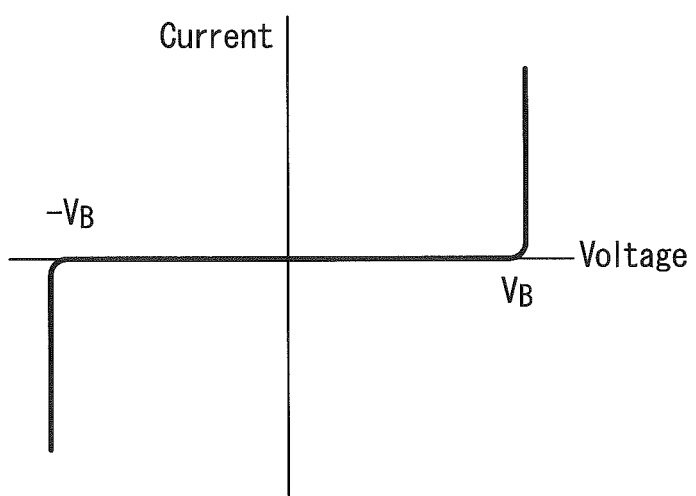
FIG. 7 is a graph illustrating an example of current-voltage characteristics of the resistor element according to the embodiment of the present invention.

In case where the impurity concentration of each of the contact regions 13c, 13d, the $n^+$-type first-polarity zones 13a and the $p^+$-type second-polarity zones 13b is $10^{18}$ per cubic-centimeter or more, each of the p-n junctions can work as a constant voltage diode, such as a Zener diode and the like utilizing Zener breakdown or avalanche breakdown. Further, as illustrated in FIG. 5, the contact plug 16a of the first external electrode 5a and the contact plug 16b of the intermediate-connecter 5c are metallurgically connected to the $n^+$-type contact regions 13c and 13d at both ends, respectively. That is, even viewed from any direction from the first external electrode 5a or the intermediate-connecter 5c, as illustrated in FIG. 6, the contact regions 13c, 13d, the $n^+$-type first-polarity zones 13a and the $p^+$-type second-polarity zones 13b are construed to be connected in the order of n-p-n-p- . . . -p-n, from one end to the other end, and step-like potentials are established by periodically arranging n-p-n hook structures. Therefore, as illustrated in FIG. 7, current-voltage characteristics are reverse characteristics in both positive and negative sides. The breakdown voltage VB may be determined by a number of stages of n-p junctions.

Here, when a working voltage is applied to a semiconductor device using the resistor element, a subject current shall flow only through the first resistive layer 3a and the second resistive layer 3b illustrated in FIG. 1. And it is necessary to prevent an unnecessary current from flowing in the pair of the first protection strips 3c and the pair of the second protection strips 3d. For example, if the working voltage of the semiconductor device is 80 volts, and the breakdown voltage VB of each of the constant voltage diodes is about 5 volts to about 6 volts, about 16 stages of p-n junctions may be used. Thus, by adjusting the number of stages of the p-n junctions, it is possible to prevent the unnecessary current flows in the first protection strips 3c and the second protection strips 3d below the operating voltage. Further, in the resistor element according to the embodiment, as illustrated in FIG. 1, the pair of the first protection strips 3c and the pair of the second protection strips 3d are arranged in parallel, above and below of the first resistive layer 3a and the second resistive layer 3b, sandwiching the first resistive layer 3a and the second resistive layer 3b. Even if each width Wr of the first resistive layer 3a and the second resistive layer 3b is required to be decreased so as to increase the resistance value of the resistor element, each width Wd of the first protection strip 3c and the second protection strip 3d can increase the effective width for ESD surge current. For example, when an ESD surge voltage equal to or higher than the working voltage is applied, surge currents may also flow through not only the first resistive layer 3a and the second resistive layer 3b, but also the first protection strip 3c and the second protection strip 3d disposed respectively above and below. Therefore, the effective width of the resistor element against the ESD surge current is (Wr+2× Wd), which is a sum of the width Wr of the first resistive layer 3a and twice the width Wd of the first protection strip 3c. Thus, even if the widths Wr of the first resistive layer 3a and the second resistive layer 3b are decreased, it is possible to secure a margin for the lower-limit criterion value of the ESD tolerance. As a result, it is possible to improve the ESD tolerance and to prevent the damage of the resistor element can be prevented, and the reliability can be improved.

Figure 8:
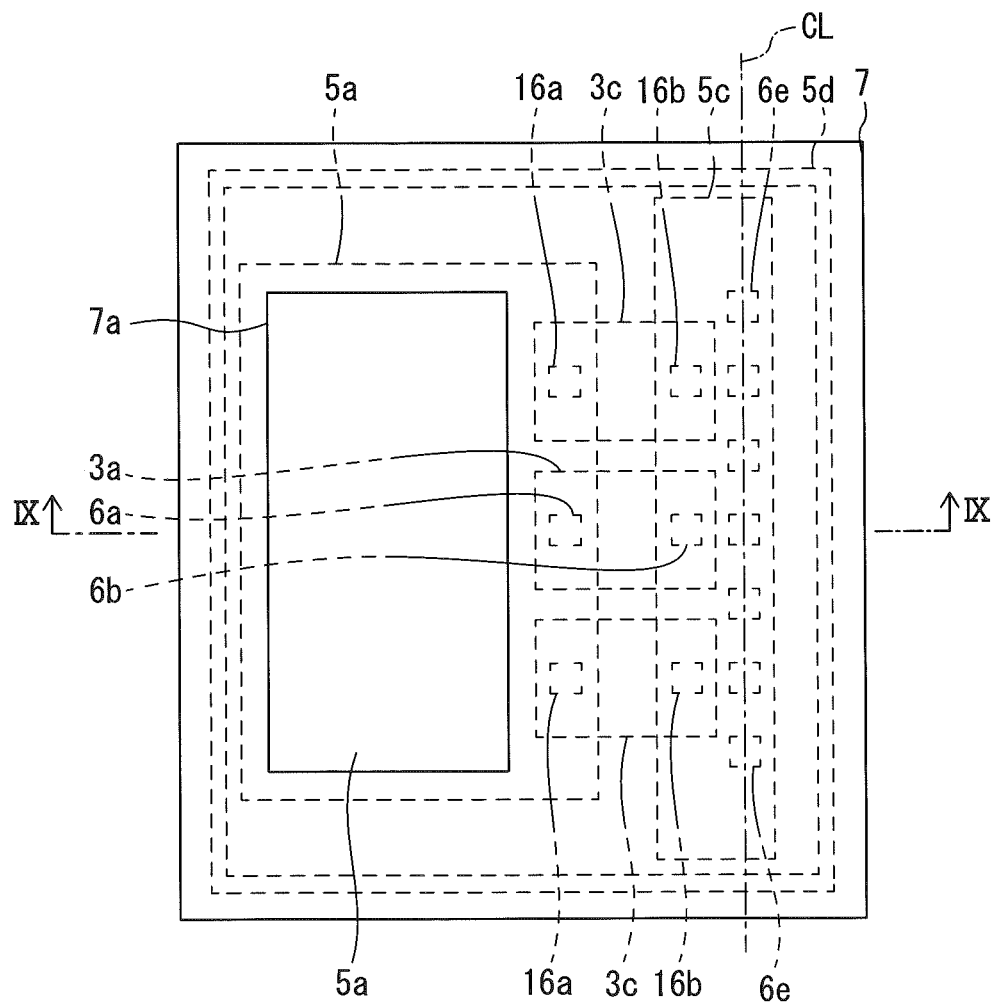
FIG. 8 is a schematic plan view illustrating another example of the resistor element according to the embodiment of the present invention.
Figure 9:
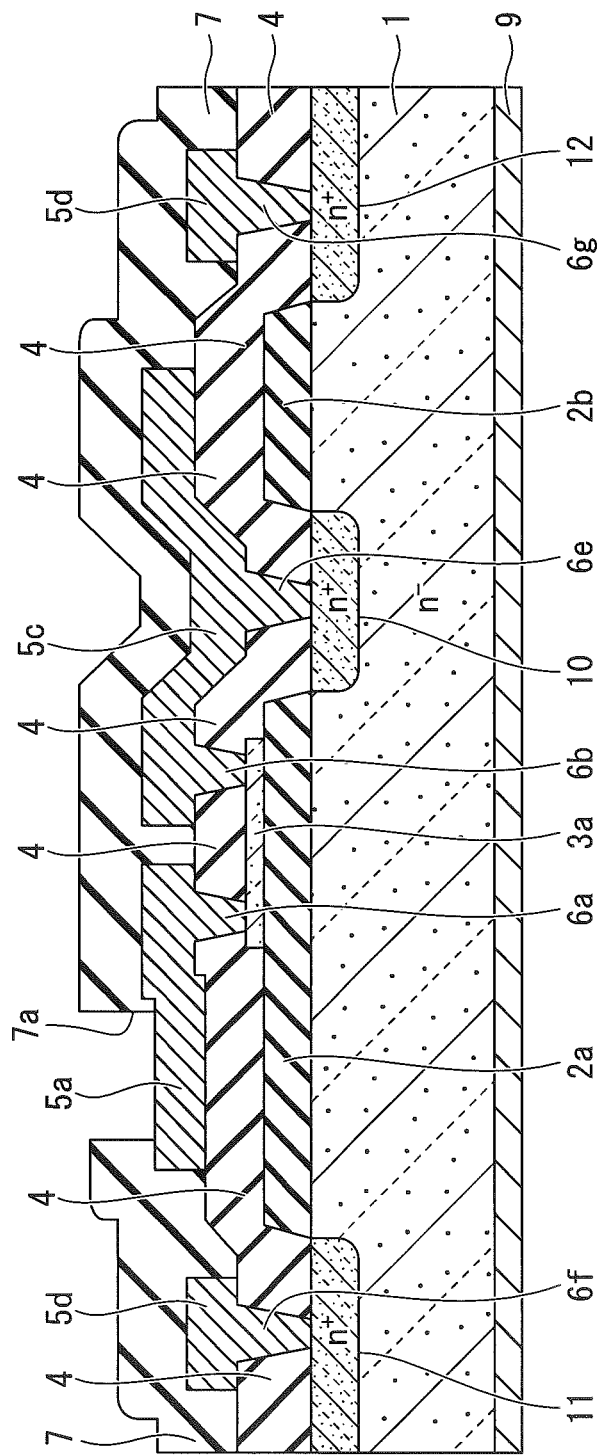
FIG. 9 is a schematic cross-sectional view of the resistor element taken along line IX-IX of FIG. 8.

In addition, as the resistor element according to the embodiment, the structure in which two of the first resistive layer 3a and the second resistive layers 3b are provided in a single chip as illustrated in FIGS. 1 and 2 is illustrated, but the present invention is not limited. As illustrated in FIGS. 8 and 9, a structure in which only one first resistive layer 3a is provided in a single chip may be used. In such case, as illustrated in FIG. 8, the pair of the first protection strips 3c are provided with the first resistive layer 3a interposed between the first protection strips 3c in the vertical direction of FIG. 8. As illustrated in FIG. 9, the structure including the second resistive layer 3b and the second external electrode 5b, which are on the right side of the resistor element illustrated in FIG. 2, may not be provided. Further, three or more resistive layers may be provided in a single chip as the resistor element according to the embodiment.

Figure 10:
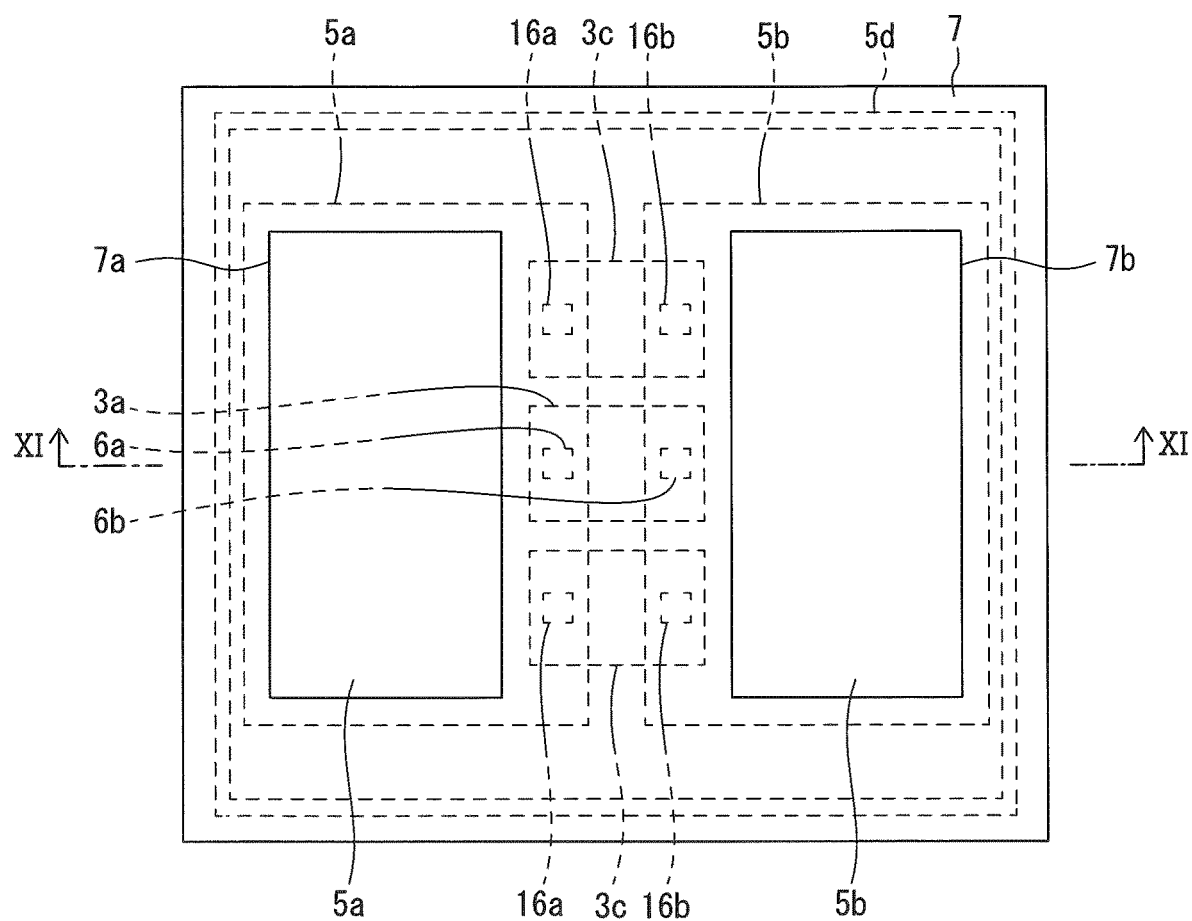
FIG. 10 is a schematic plan view illustrating another example of the resistor element according to the embodiment of the present invention.
Figure 11:
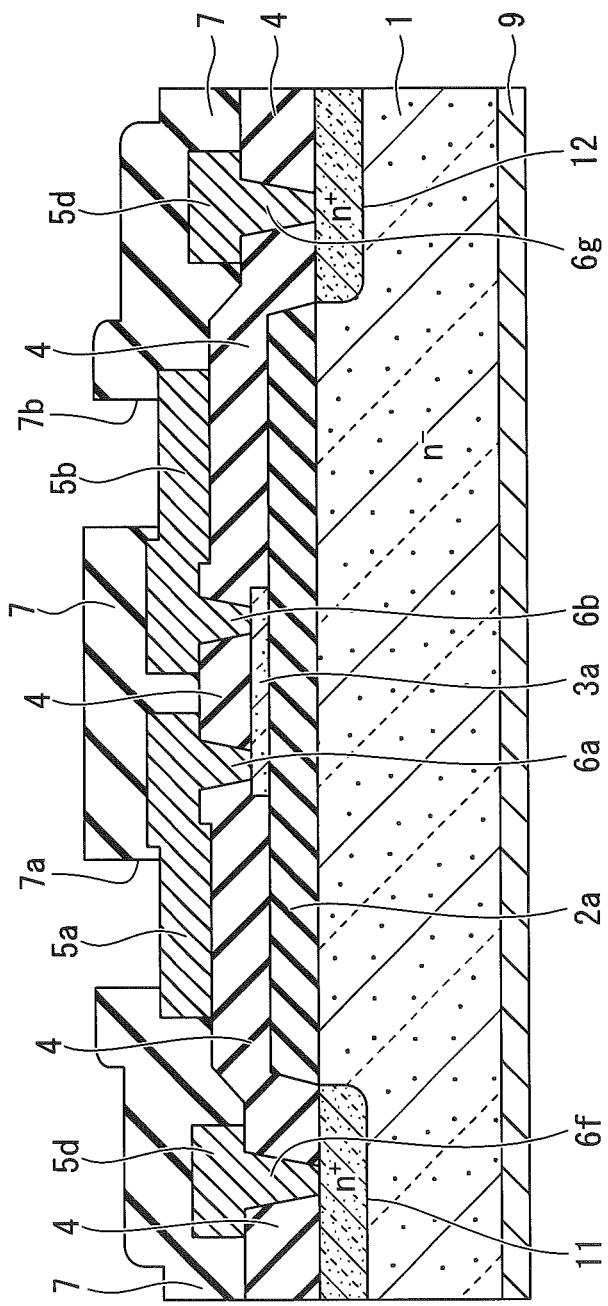
FIG. 11 is a schematic cross-sectional view of the resistor element taken along line XI-XI in FIG. 10.

Furthermore, as the resistor element according to the embodiment, as illustrated in FIGS. 1 and 2, although the resistor element having the vertical structure connected to the semiconductor substrate 1 via the intermediate-connecter 5c is illustrated, the resistor element may be a horizontal structure which omits the intermediate-connecter 5c and the contact region 10. For example, as illustrated in FIGS. 10 and 11, not only the intermediate-connecter 5c and the contact region 10 are omitted, but also the structure including the lower-layer insulating-film 2b and the second resistive layer 3b as illustrated in FIG. 2, may not be provided. In the case of the horizontal structure, when the bottom surface of the semiconductor substrate 1 is mounted on a circuit board or the like with an adhesive or the like, the counter electrode 9 may be omitted.

<Triple-Phase Inverter>

Figure 12:
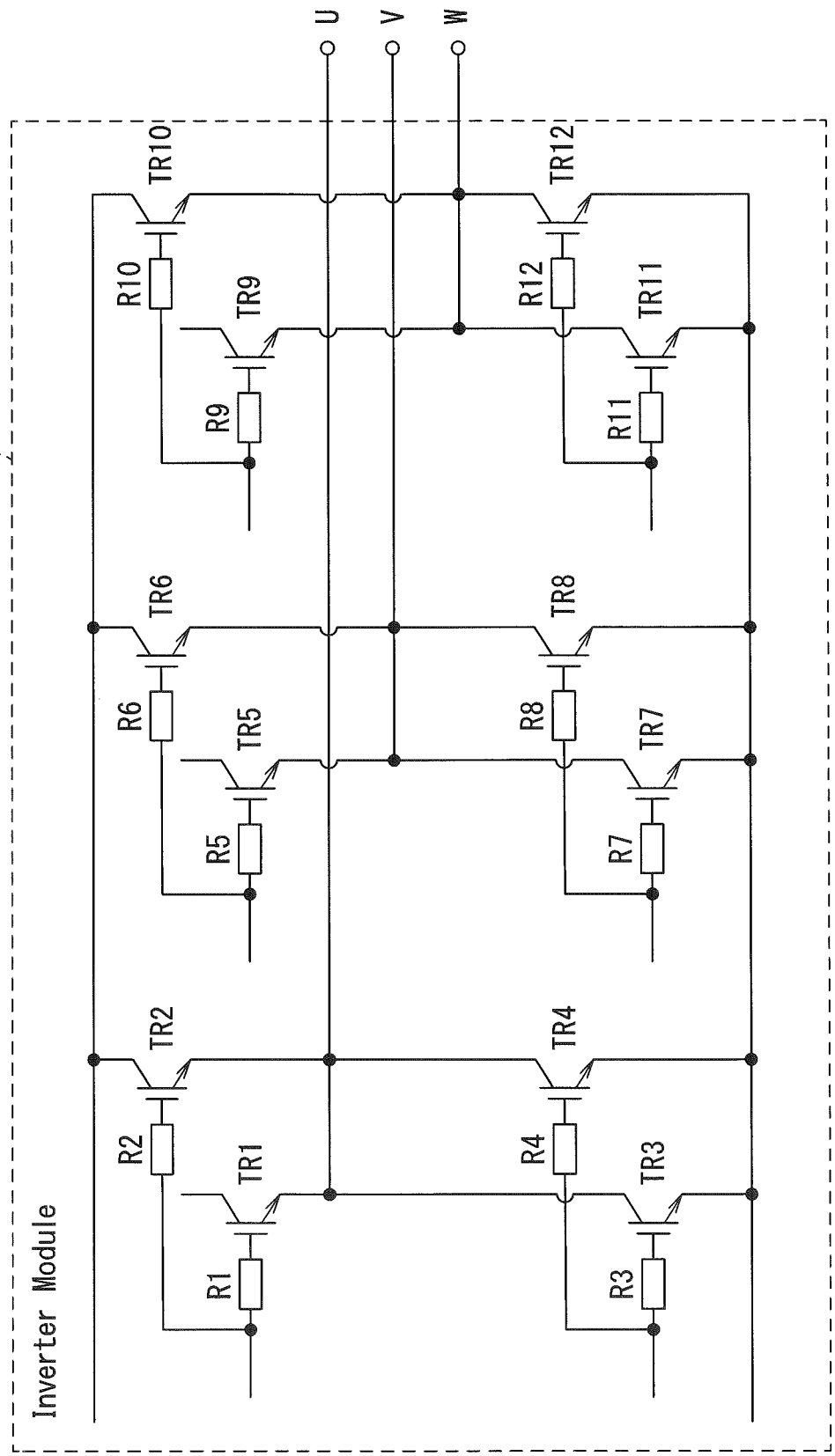
FIG. 12 is a circuit diagram illustrating an application example of the resistor element according to the embodiment of the present invention.

The resistor element according to the embodiment may be applied to an inverter module 100 that drives a triple-phase motor including, for example, u-phase, v-phase, and w-phase, as illustrated in FIG. 12. The inverter module 100 includes power semiconductor devices TR1, TR2, TR3, TR4 for driving the u-phase, power semiconductor devices TR5, TR6, TR7, TR8 for driving the v-phase, power semiconductor device TR9, TR10, TR11, TR12 for driving the w-phase. Flyback diodes (not shown) are connected to the power semiconductor devices TR1 to TR12, respectively. An IGBT may be used for each of the power semiconductor devices TR1 to TR12, and first to twelfth gate resistors R1 to R12 are connected to respective gate electrodes of the IGBTs in order to prevent the oscillation phenomenon at the time of switching operation.

The resistor element according to the embodiment illustrated in FIG. 1 and FIG. 2 may be applied, for example, to a pair of the first gate resistor R1 and the second gate resistor R2. Alternatively, the resistor element according to the embodiment may be applied to a pair of the third gate resistor R3 and the fourth gate resistor R4. Also, the resistor element according to the embodiment may be applied to a pair of the fifth gate resistor R5 and the sixth gate resistor R6, a pair of the seventh gate resistor R7 and the eighth gate resistor R8, a pair of the ninth gate resistor R9 and the tenth gate resistor R10, and a pair of the eleventh gate resistor R11 And the twelfth gate resistor R12, respectively. For example, the first resistive layer 3a illustrated in FIGS. 1 and 2 corresponds to the first gate resistance R1, and the second resistive layer 3b corresponds to the gate resistance R2. One terminal side of the first gate resistor R1 connected to the gate electrode of the first power semiconductor device TR1 corresponds to a terminal on the first external electrode 5a illustrated in FIG. 1. One terminal side of the second gate resistor R2 connected to the gate electrode of the second power semiconductor device TR2 corresponds to a terminal on the second external electrode 5b illustrated in FIG. 1. Further, the other terminals of the first gate resistor R1 and the second gate resistor R2 on the opposite sides connected to the gate electrodes of the first power semiconductor device TR1 and the second power semiconductor device TR2 correspond to the terminal of the counter electrode 9 illustrated in FIG. 2.

In the resistor element according to the embodiment applied to each of the first gate resistance R1 and the second gate resistance R2 of the inverter module 100, as illustrated in FIG. 1, the pair of the first protection strips 3c and the pair of the second protection strips 3d are arranged in parallel with the first resistive layer 3a and the second resistive layer 3b. Even if the widths Wr of the first resistive layer 3a and the second resistive layer 3b are required to be decreased so as to increase the resistance value of the resistor element, the widths Wd of the pair of the first protection strips 3c and the pair of the second-resistive-layer protection strips 3d can increase the effective width for the ESD surge current. The same applies to the third gate resistance R1 to the twelfth gate resistance R12. For example, when the ESD surge voltage equal to or higher than the working voltage of the inverter module 100 is applied, the surge current can flow through not only the first resistive layer 3a and the second resistive layer 3b but also the first protection strips 3c and the second protection strips 3d. Therefore, the effective width of the resistor element against the ESD surge current can be (Wr+2×Wd), which is a sum of the width Wr of the first resistive layer 3a and twice the width Wd of the first protection strip 3c. As described above, even if the widths Wr of the first resistive layer 3a and the second resistive layer 3b are decreased, it is possible to secure a margin with respect to the lower-limit criterion value of the ESD tolerance. As a result, the ESD tolerance can be improved, and damage to each of the first gate resistance R1 to the twelfth gate resistance R12 of the inverter module 100 can be prevented to improve the reliability.

<Manufacturing Method of Resistor Element>

Figure 13:
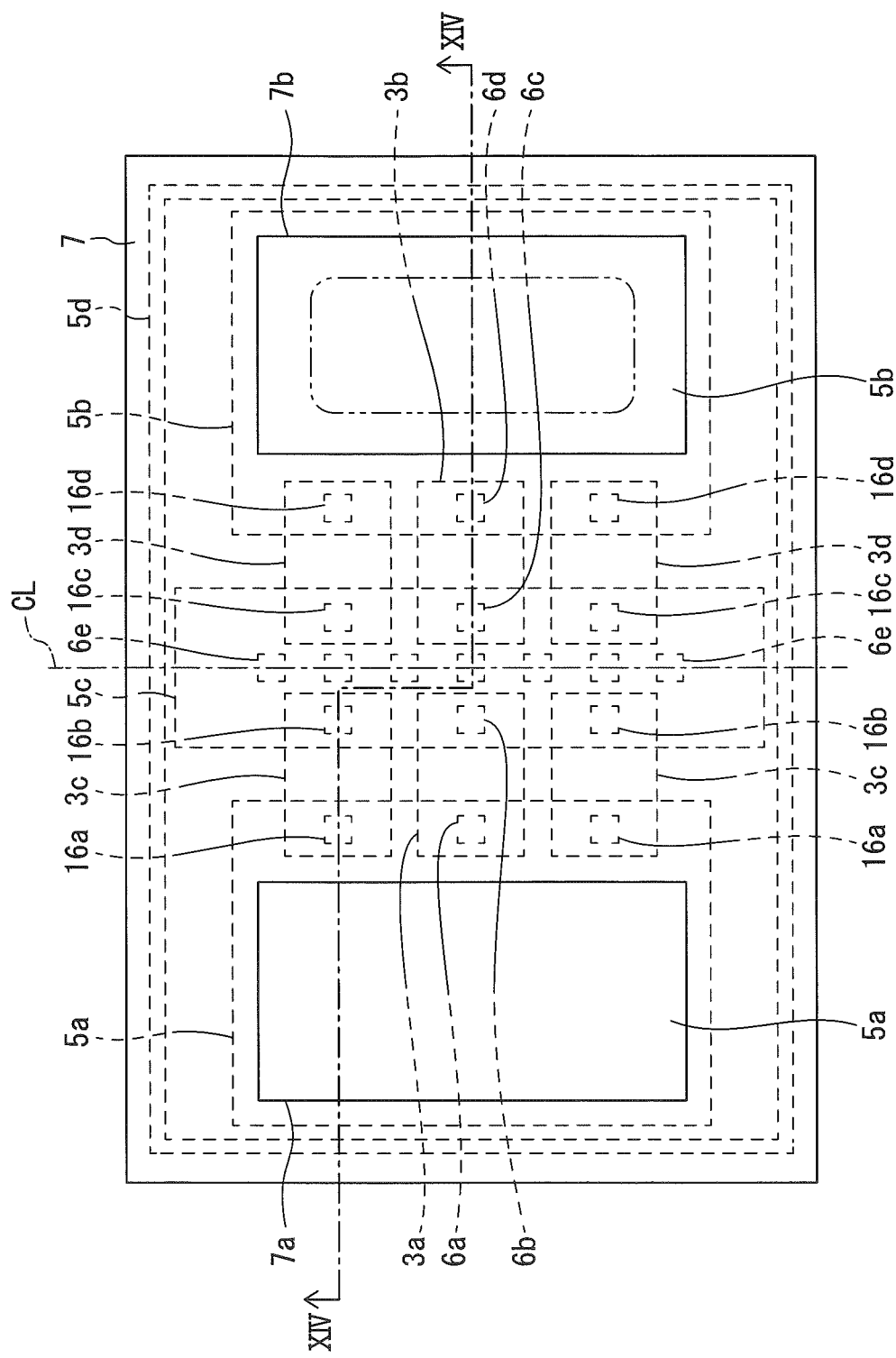
FIG. 13 is a schematic plan view illustrating a position of a cross-section used to explain an example of a manufacturing method of the resistor element according to the embodiment of the present invention.

Next, with reference to FIGS. 14 to 26, which are cross-sectional views taken along the cranked line XIV-XIV illustrated in the plan view of FIG. 13, an example of a manufacturing method of the resistor element according to the embodiment of the present invention will be described.

Note that the manufacturing method of the resistor element described below is merely an example and may be achieved by various other manufacturing methods including a modification as long as the gist described in the claims is included.

Figure 14:
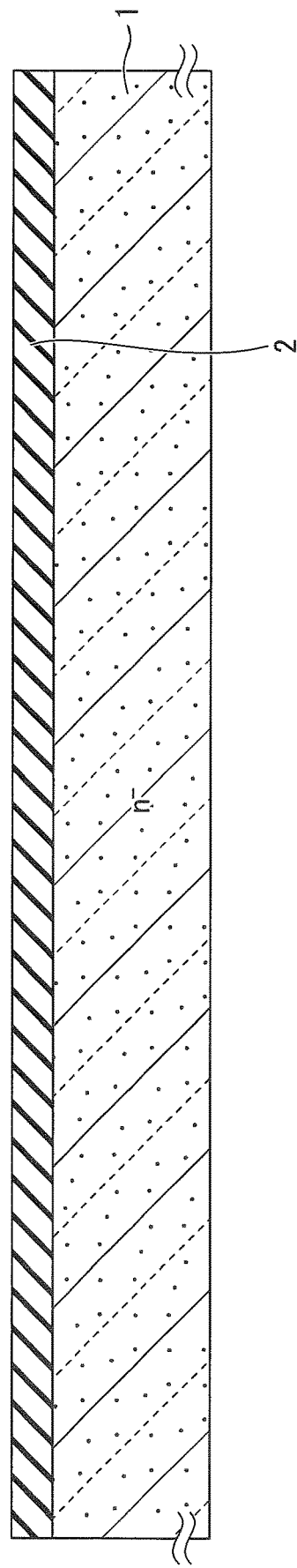
FIG. 14 is a cross-sectional view illustrating an example of a process in the manufacturing method of the resistor element according to the embodiment of the present invention.
Figure 15:
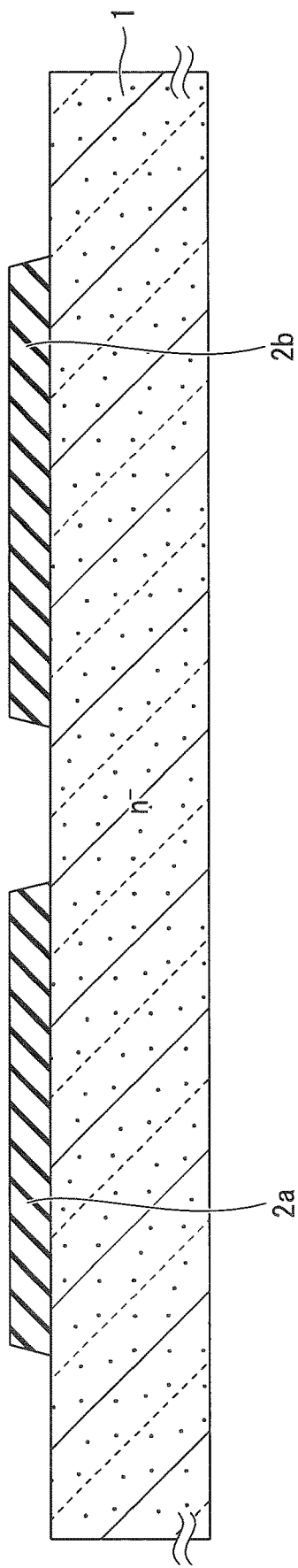
FIG. 15 is a cross-sectional process view illustrating an example of a process subsequent to FIG. 14 in the manufacturing method of the resistor element according to the embodiment of the present invention.

First, the semiconductor substrate 1, such as an n⁻-type silicon substrate, is prepared. As illustrated in FIG. 14, a lower-layer insulating-film 2, such as a TEOS film and the like, is deposited on the semiconductor substrate 1 by low pressure chemical vapor deposition (LPCVD) or the like. In addition, the lower-layer insulating-film 2 may be a composite film in which after a thermal oxide film is formed by a thermal oxidation method, an insulating film is deposited on the thermal oxide film by a CVD method or the like, to laminate the thermal oxide film and the deposited insulating film. Subsequently, a pattern of a photoresist film is delineated on the lower-layer insulating-film 2 by photolithography. By using the delineated pattern of the photoresist film as an etching mask, a part of lower-layer insulating-film 2 is selectively removed by dry etching, such as reactive ion etching (RIE) and the like. Thereafter, the photoresist film is removed. As a result, the lower-layer insulating-films 2a, 2b are formed on a part of semiconductor substrate 1 as illustrated in FIG. 15. Although different numerals are given as the "lower-layer insulating-films 2a, 2b" in FIG. 15, the lower-layer insulating-films 2a, 2b may be a single film which is continuous in the back or the like of the paper surface. The cross-sectional view of FIG. 15 illustrates a window, or an opening, provided at the center of the continuous lower-layer insulating-film.

Figure 16:
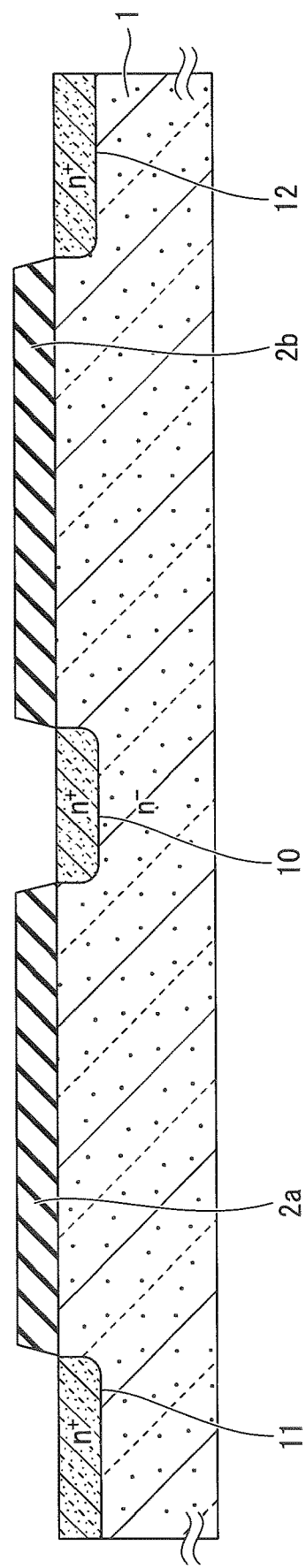
FIG. 16 is a cross-sectional view illustrating an example of a process subsequent to FIG. 15 in the manufacturing method of the resistor element according to the embodiment of the present invention.

Next, another pattern of another photoresist film is delineated on the semiconductor substrate 1 and the lower-layer insulating-films 2a, 2b by photolithography. By using the delineated pattern of the photoresist film as a mask for ion implantation, n-type impurity ions, such as phosphorus (P) ions and the like, are selectively implanted. Thereafter, after removing the photoresist film used as the mask for ion implantation, the impurity ions are activated by annealing. As a result, as illustrated in FIG. 16, the n⁺-type contact region 10 is formed in the center of the upper portion of the semiconductor substrate 1. At the same time, the n⁺-type contact regions 11, 12 are formed as a continuous ring-shaped region around the upper portion of the semiconductor substrate 1.

Figure 17:
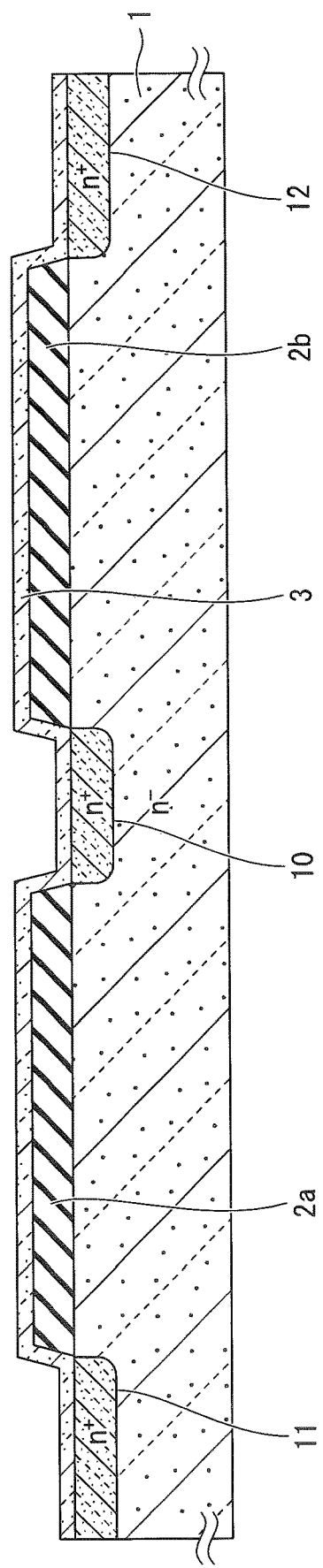
FIG. 17 is a cross-sectional view illustrating an example of a process subsequent to FIG. 16 in the manufacturing method of the resistor element according to the embodiment of the present invention.
Figure 18:
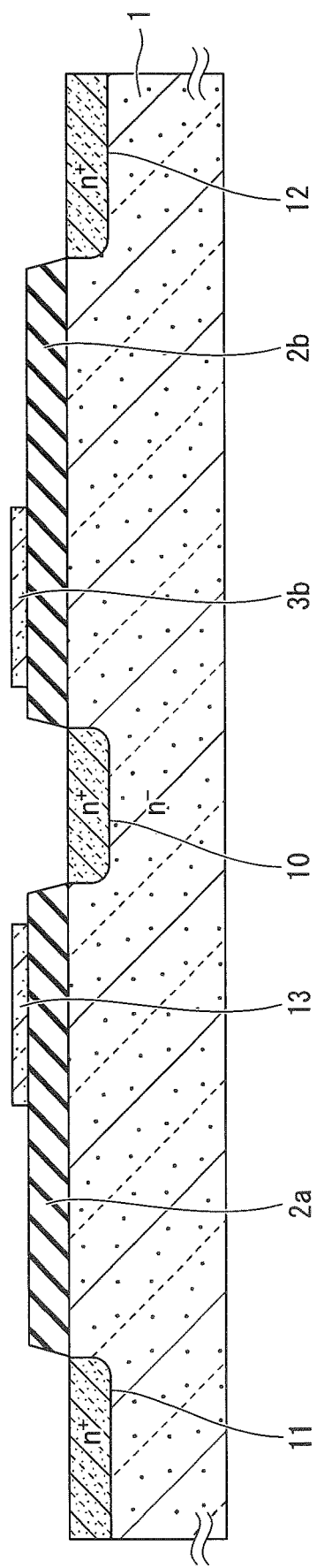
FIG. 18 is a cross-sectional view illustrating an example of a process subsequent to FIG. 17 in the manufacturing method of the resistor element according to the embodiment of the present invention.

Next, a non-doped polysilicon film is deposited on the semiconductor substrate 1 and the lower-layer insulating-films 2a, 2b by the CVD method or the like. Then, n-type impurity ions, such as phosphorus (P) ions and the like, are ion implanted into the polysilicon film. For example, the phosphorus (P) ions are ion-implanted at an acceleration voltage of 80 kilo-electron-volts and a dose of about 6.0× 10¹⁵ per-square-centimeter or less. Thereafter, the implanted ions are activated by annealing to form the DOPOS film 3 to which n-type impurity atoms are doped at a high concentration, as illustrated in FIG. 17. Subsequently, still another pattern of another photoresist film is delineated on the DOPOS film 3 by photolithography. A portion of the DOPOS film 3 is selectively removed by RIE or the like using the delineated pattern of the photoresist film as an etching mask. Thereafter, the photoresist film is removed. As a result, as illustrated in FIG. 18, the DOPOS film 13, in which the n⁺-type DOPOS film 3 has been cut on the lower-layer insulating-film 2a, is formed, and the second resistive layer 3b, which the n⁺-type DOPOS film 3 has been cut on the lower-layer insulating-film 2b, is formed.

Figure 20:
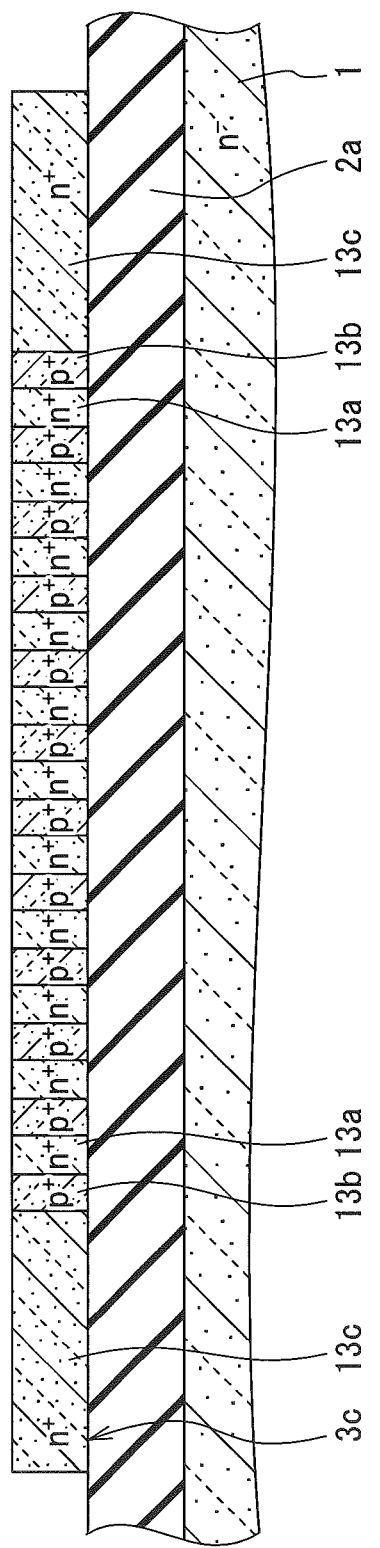
FIG. 20 is a cross-sectional view illustrating an example of a process subsequent to FIG. 19 in the manufacturing method of the resistor element according to the embodiment of the present invention.

Next, yet still another pattern of another photoresist film is delineated by photolithography so that a part of surface of the DOPOS film 13 is exposed on the n$^+$-type DOPOS film 13. By using the delineated pattern of the photoresist film as a mask, p-type impurity ions, such as B and the like, are selectively ion-implanted into the DOPOS film 13. For example, B ions are implanted at an acceleration voltage of 100 kilo-electron-volts and a dose of about $1\times10^{14}$ per square-centimeter. Thereafter, the photoresist film is removed, and the implanted ions are activated by annealing. Then, a plurality of the second-polarity zones 13b to which p-type impurity ions are doped at a high concentration, are formed, and the remaining n$^+$-type DOPOS films 13 are assigned to the contact region 13c and the plurality of the n$^+$-type first-polarity zones 13a. As a result, as illustrated in FIG. 20, a plurality of p-n junctions are formed by the n$^+$-type contact region 13c, the plurality of n$^+$-type first-polarity zones 13a, and the plurality of p$^+$-type second-polarity zones 13b.

Figure 19:
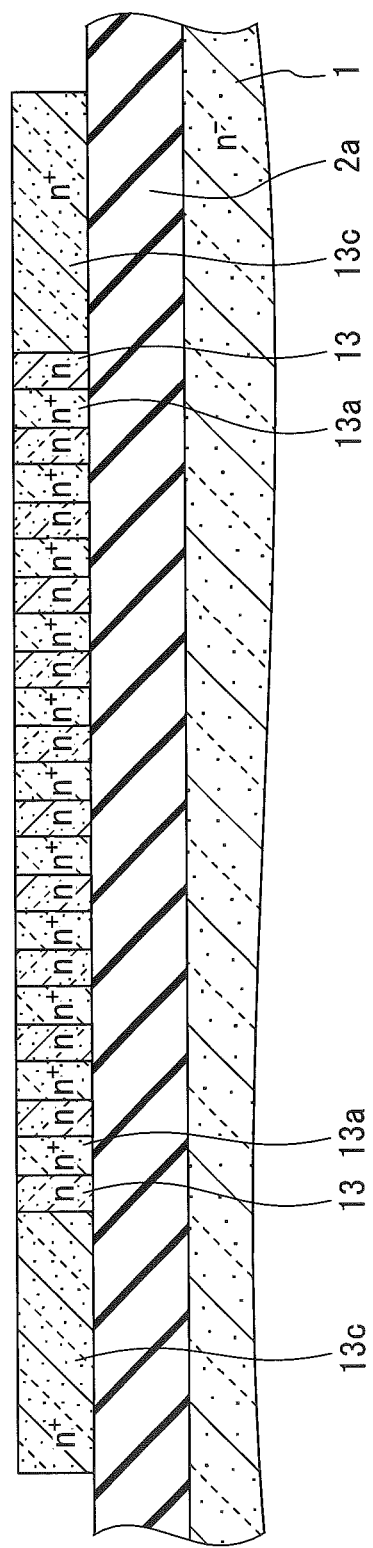
FIG. 19 is a cross-sectional view illustrating an example of a process subsequent to FIG. 18 in the manufacturing method of the resistor element according to the embodiment of the present invention.

When it is desired to further increase the concentrations of the n$^+$-type stripes 13, additional implantation of n-type impurity ions, such as P ions and the like, may be selectively executed by using a delineated pattern of the other photoresist film as a mask. For example, additional implantation of P ions is executed at an acceleration voltage of 100 kilo-electron-volts and a dose of about $1\times10^{15}$ per-square-centimeter. Thereafter, the photoresist film is removed, and the implanted ions are activated by annealing. Then, as illustrated in FIG. 19, it is possible to selectively define the plurality of n$^+$-type first-polarity zones 13a to which the n-type impurity ions are doped at a higher concentration.

Figure 21:
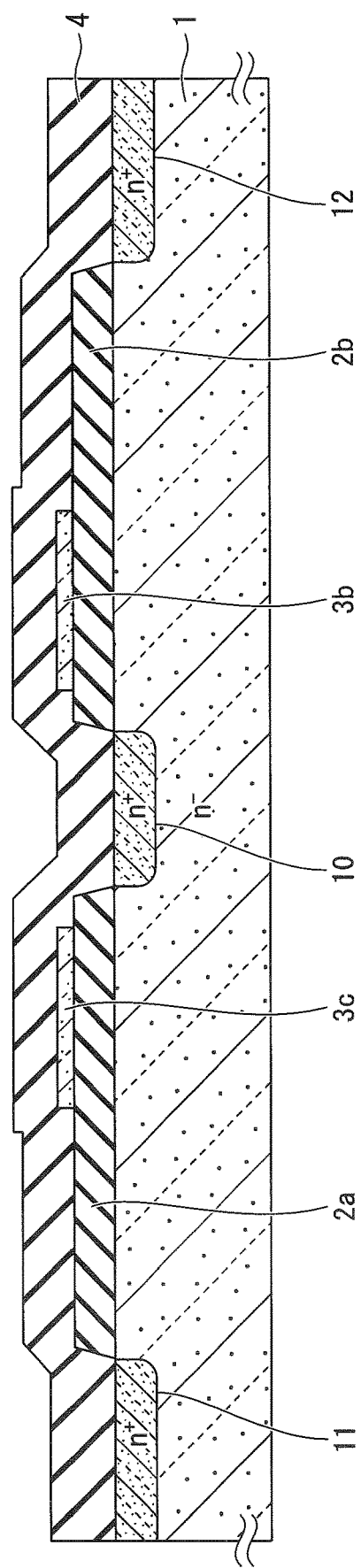
FIG. 21 is a cross-sectional view illustrating an example of a process subsequent to FIG. 20 in the manufacturing method of the resistor element according to the embodiment of the present invention.
Figure 22:
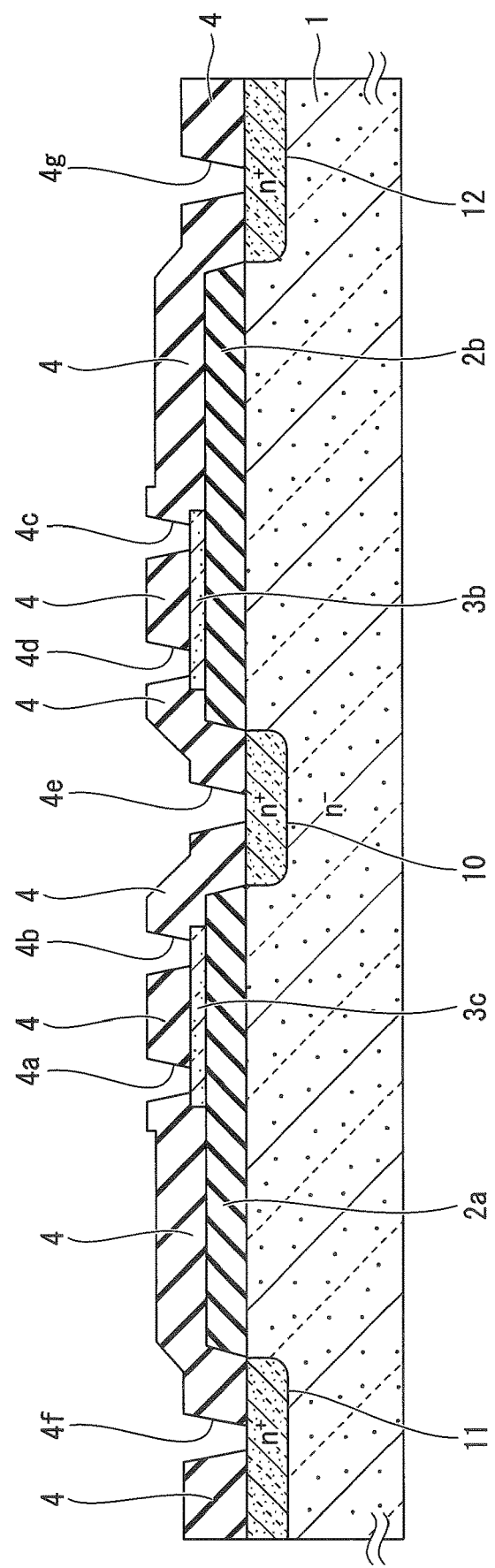
FIG. 22 is a cross-sectional view illustrating an example of a process subsequent to FIG. 21 in the manufacturing method of the resistor element according to the embodiment of the present invention.

Next, as illustrated in FIG. 21, the interlayer insulating film 4 is deposited so as to cover the lower-layer insulating-films 2a, 2b, the first protection strip 3c, and the second resistive layer 3b. For example, the NSG film and the PSG film are sequentially deposited by a CVD method or the like, and the interlayer insulating film 4 can be formed of a composite film in which the NSG film and the PSG film are laminated. Subsequently, a further pattern of another photoresist film is delineated on the interlayer insulating film 4 by photolithography. A part of interlayer insulating film 4 is selectively removed by RIE or the like using the delineated pattern of the photoresist film as an etching mask. Thereafter, the photoresist film is removed. As a result, as illustrated in FIG. 22, a first contact hole 4a, a second contact hole 4b, a third contact hole 4c, a fourth contact hole 4d and a fifth contact hole 4e are opened in the interlayer insulating film 4. At the same time, the sixth contact hole 4f and the seventh contact hole 4g are also formed in the interlayer insulating film 4.

Figure 23:
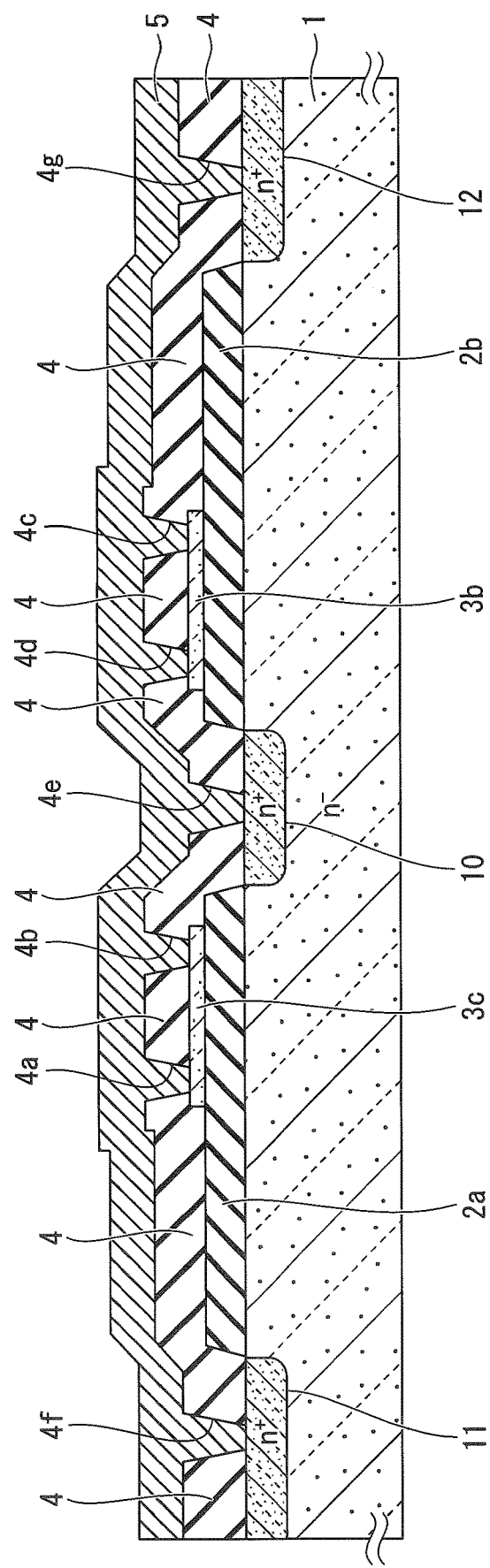
FIG. 23 is a cross-sectional view illustrating an example of a process subsequent to FIG. 22 in the manufacturing method of the resistor element according to the embodiment of the present invention.
Figure 24:
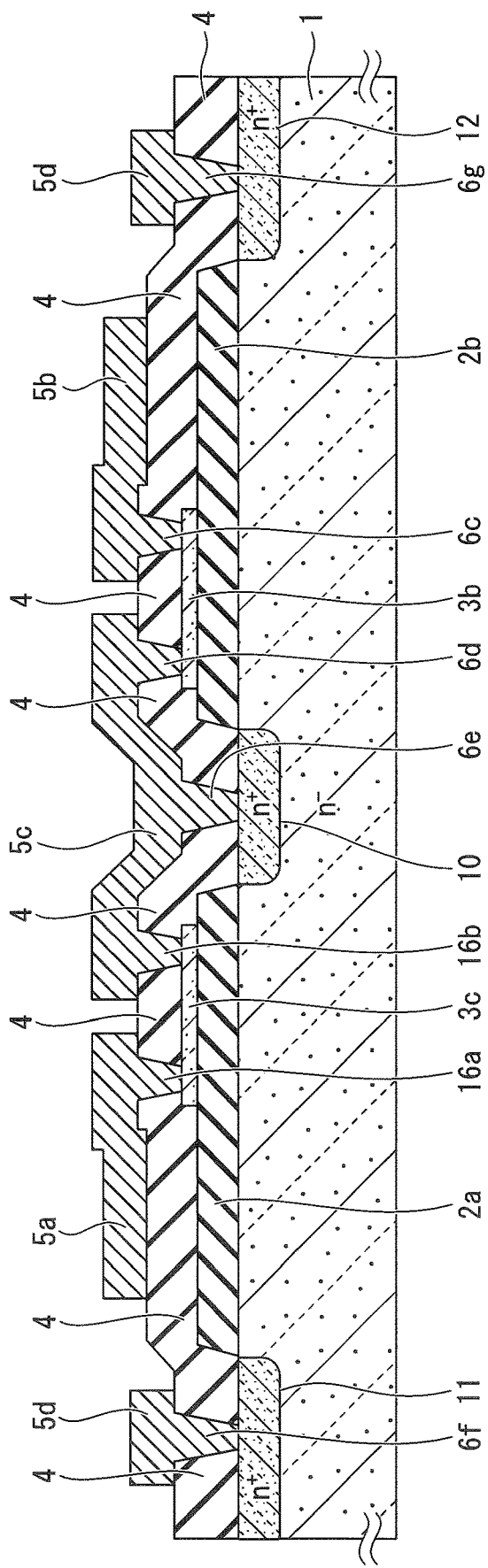
FIG. 24 is a cross-sectional view illustrating an example of a process subsequent to FIG. 23 in the manufacturing method of the resistor element according to the embodiment of the present invention.

Next, as illustrated in FIG. 23, a metal film 5 is deposited on the interlayer insulating film 4 so as to fill the contact holes 4a to 4g by vacuum evaporation, sputtering or the like. The metal film 5 may be formed, for example, by sequentially depositing Ti/TiN, Al—Si, and TiN/Ti by a CVD method or the like. Subsequently, a further pattern of another photoresist film is delineated on the metal film 5 by photolithography. A portion of the metal film 5 is selectively removed by using the delineated pattern of the photoresist film as an etching mask. As a result, as illustrated in FIG. 24, the first external electrode 5a, the second external electrode 5b, the intermediate-connecter 5c, and the guard-ring layer 5d are formed on the interlayer insulating film 4.

At this time, the contact plug 16a connecting the first external electrode 5a to the first protection strip 3c through the first contact hole 4a, is formed. And the contact plug 16b connecting the intermediate-connecter 5c to the first protection strip 3c through the second contact hole 4b, is formed. Further, the contact plug 6e connecting the intermediate-connecter 5c to the contact region 10 in the upper portion and center of the semiconductor substrate 1 through the fifth contact hole 4e is also formed. Furthermore, the contact plug 6c connecting the second external electrode 5b to the second resistive layer 3b through the third contact hole 4c, and the contact plug 6d connecting the intermediate-connecter 5c to the second resistive layer 3b through the fourth contact hole 4d are also formed. Further, contact plugs 6f, 6g connecting the guard-ring layer 5d to the contact regions 11, 12 in the upper periphery of the semiconductor substrate 1 through the sixth contact hole 4f and the seventh contact hole 4g are also formed.

Figure 25:
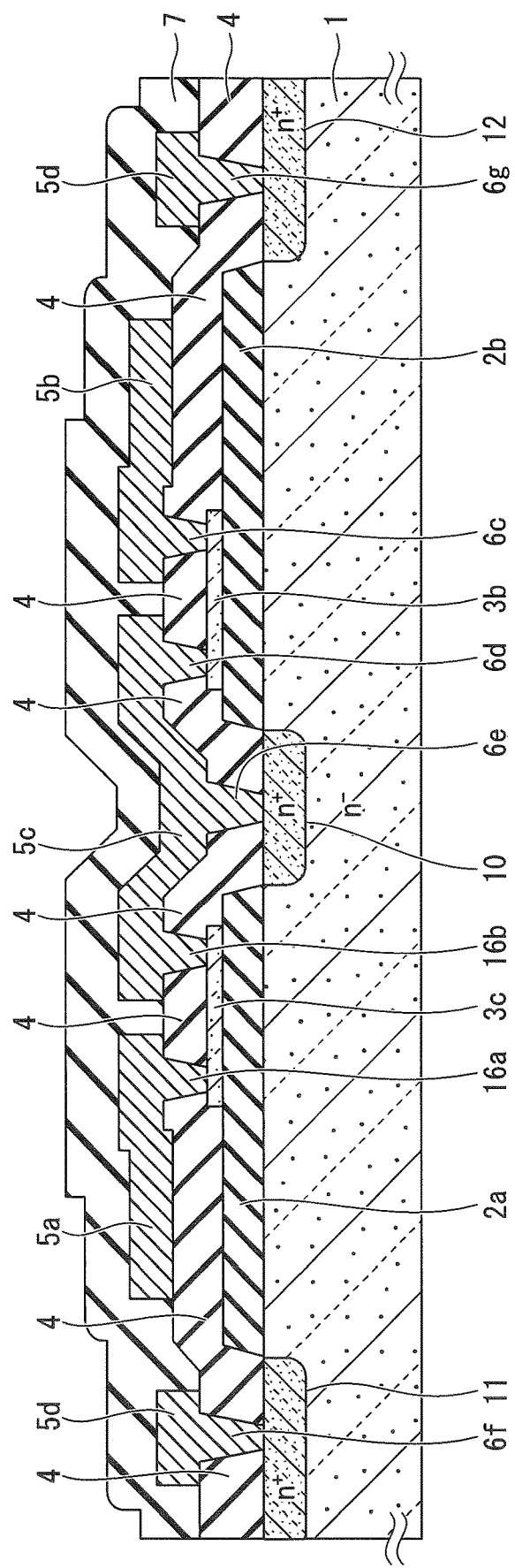
FIG. 25 is a cross-sectional view illustrating an example of a process subsequent to FIG. 24 in the manufacturing method of the resistor element according to the embodiment of the present invention.
Figure 26:
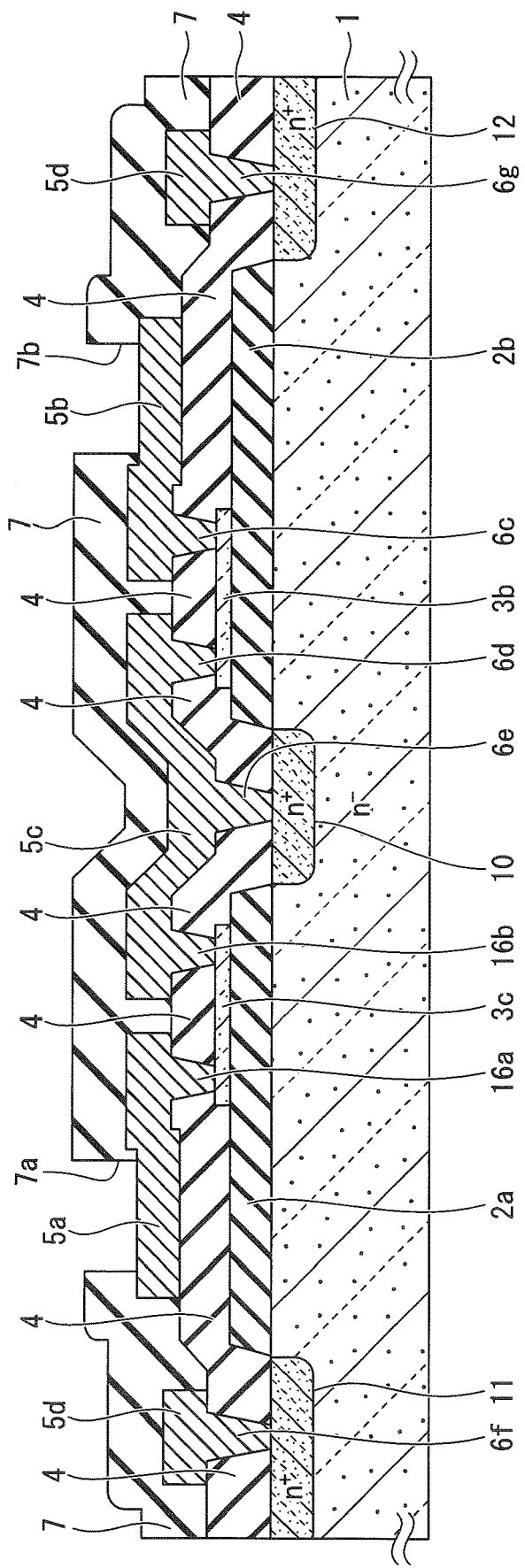
FIG. 26 is a cross-sectional view illustrating an example of a process subsequent to FIG. 25 in the manufacturing method of the resistor element according to the embodiment of the present invention.

Next, as illustrated in FIG. 25, the protective film 7 is deposited on the first external electrode 5a, the second external electrode 5b, the intermediate-connecter 5c, and the guard-ring layer 5d. For example, a TEOS film and a Si$_3$N$_4$ film are sequentially deposited by plasma CVD or the like, and a polyimide film is applied to form a protective film 7 composed of the TEOS film, the Si$_3$N$_4$ film, and the polyimide film. Subsequently, a further pattern of another photoresist film is delineated on the protective film 7 by photolithography. A part of the protective film 7 is selectively removed using the delineated pattern of the photoresist film as an etching mask. As a result, as illustrated in FIG. 26, the first window 7a and the second window 7b are formed in the protective film 7. And a pair of the first external electrode 5a and the second external electrode 5b, exposed at the first window 7a and the second window 7b, are served as pad regions for mounting.

Next, the bottom surface of the semiconductor substrate 1 is polished by chemical mechanical polishing (CMP) or the like to reduce the thickness of the semiconductor substrate 1 to about 350 micrometers. Thereafter, the counter electrode 9 is formed on the bottom surface of the semiconductor substrate 1 by a vacuum evaporation method, a sputtering method, or the like. Note that many elements similar to the resistor element illustrated in FIGS. 1 and 2 are formed on a single wafer as a chip area in the form of a matrix, and the chip areas are separated into chips having the resistor element by dicing as illustrated in FIGS. 1 and 2.

In the manufacturing method of the resistor element according to the embodiment, even if the widths Wr of the first resistive layer 3a and the second resistive layer 3b are decreased, a margin with respect to the lower-limit criterion value of the ESD tolerance can be secured. As a result, the ESD tolerance can be improved, and a resistor element capable of improving the reliability by preventing damage to the resistor element can be easily achieved.

Other Embodiments

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

For example, as the resistor element according to the embodiment, as illustrated in FIG. 1, the structure, in which the pair of first protection strips 3c and the pair of second protection strips 3d are provided with the same width Wd to sandwich the first resistive layer 3a and the second resistive layer 3b, is illustrated. However, the widths Wd of the first protection strip 3c on the upper side and the other first protection strip 3c on the lower side may be different from each other. Similarly, the widths Wd of the one second protection strip 3d on the upper side and the other second protection strip 3d on the lower side may be different from each other. Alternatively, each of the first protection strip 3c and the second protection strip 3d may be provided solely in a single side. When the first protection strip 3c and the second protection strip 3d are arranged unevenly in a direction of the long-side of the first external electrode 5a and the second external electrode 5b, the ESD surge current may flow unevenly. Therefore, heat generation of the resistor element becomes uneven and stress is easily generated in the resistor element. Therefore, as illustrated in FIG. 1, it is desirable so that the first protection strip 3c and the second protection strip 3d are provided symmetrically in the vertical direction with respect to the first resistive layer 3a and the second resistive layer 3b.

Further, although the case where the resistor element according to the embodiment of the present invention is applied as the first gate resistance R1 to the twelfth gate resistance R12 as illustrated in FIG. 12, is illustrated, the resistor element according to the embodiment of the present invention is not limited to the first gate resistance R1 to the twelfth gate resistance R12. The resistor element according to the embodiment of the present invention is applicable as resistor elements of various ICs.

What is claimed is:

1. A resistor element, comprising:
a lower-layer insulating-film;
a rectangular first resistive layer defined by first and second sidewalls, disposed on the lower-layer insulating-film;
a first protection strip disposed on the lower-layer insulating-film in parallel with the first sidewall of the first resistive layer, implemented by a tandem connection of a plurality of p-n junctions, the tandem connection including alternate arrangements of a first-polarity zone of a first conductivity type and a second-polarity zone of a second conductivity type;
an interlayer insulating film covering the first resistive layer and the first protection strip;
a first external electrode disposed on the interlayer insulating film, being physically and electrically connected to a terminal of the first resistive layer via a first contact plug and a terminal of the first protection strip via a second contact plug; and
a second external electrode disposed on the interlayer insulating film, being physically and electrically connected to another terminal of the first resistive layer via a third contact plug and another terminal of the first protection strip via a fourth contact plug,
wherein
the first resistive layer and the first protection strip are electrically connected to each other in parallel.

2. The resistor element of claim 1, further comprising a semiconductor substrate, wherein the lower-layer insulating-film is disposed on a top surface of the semiconductor substrate.

3. The resistor element of claim 1, further comprising:
a counterpart first protection strip of the first protection strip, disposed on the lower-layer insulating-film in parallel with the second sidewall of the first resistive layer, implemented by a counterpart tandem connection of a plurality of p-n junctions, the counterpart tandem connection including alternate arrangements of another first-polarity zone of the first conductivity type and another second-polarity zone of the second conductivity type,
wherein the first external electrode is electrically connected to a terminal of the counterpart first protection strip, and the second external electrode is electrically connected to another terminal of the counterpart first protection strip, and
the first resistive layer and the counterpart first protection strip are electrically connected to each other in parallel.

4. The resistor element of claim 1, wherein
the first contact plug is disposed in a first contact hole provided in the interlayer insulating film, between the first resistive layer and the first external electrode, and
the second contact plug is disposed in a second contact hole provided in the interlayer insulating film, between the first protection strip and the first external electrode.

5. The resistor element of claim 1, wherein
the first resistive layer extends, in a width direction of the first resistive layer, between the first external electrode and the second external electrode, and
the first protection strip extends, in the width direction of the first resistive layer, between the first external electrode and the second external electrode.

6. The resistor element of claim 2, wherein
the first protection strip includes a first contact region of the first conductivity type electrically connected to the first external electrode, and a second contact region of the first conductivity type electrically connected to the second external electrode, and the first-polarity zone and the second-polarity zone are alternately and repeatedly arranged between the first contact region and the second contact region,
the semiconductor substrate is of the first conductivity type, and
the first contact region has a higher impurity concentration than the semiconductor substrate.

7. The resistor element of claim 1, wherein
the first external electrode has a first rectangular planar pattern when the resistor element is viewed in a plan view,
the second external electrode has a second rectangular planar pattern when the resistor element is viewed in the plan view, and
a longer side of the first rectangular planar pattern is in parallel with a longer side of the second rectangular pattern.

8. The resistor element of claim 7, wherein
the first external electrode extends continuously in a longitudinal direction which is parallel to the longer side of the first rectangular pattern, and
the second external electrode extends continuously in the longitudinal direction which is parallel to the longer side of the second rectangular pattern.

9. The resistor element of claim 1, further comprising:
a rectangular second resistive layer defined by first and second sidewalls, disposed on the lower-layer insulating-film; and
a third external electrode disposed on the interlayer insulating film, being physically and electrically connected to a terminal of the second resistive layer via a fifth contact plug,
wherein the second external electrode is physically and electrically connected to another terminal of the second resistive layer via a sixth contact plug.

10. The resistor element of claim 1, further comprising:
a second protection strip disposed on the lower-layer insulating-film, implemented by a tandem connection of a plurality of p-n junctions, the tandem connection including alternate arrangements of the first-polarity zone of the first conductivity type and the second-polarity zone of the second conductivity type; and
a third external electrode disposed on the interlayer insulating film, being physically and electrically connected to a terminal of the second resistive layer via a fifth contact plug,
wherein the second external electrode is physically and electrically connected to another terminal of the second protection strip.

11. A resistor element, comprising:
a semiconductor substrate;
a lower-layer insulating-film disposed on a top surface of the semiconductor substrate;
a rectangular first resistive layer defined by first and second sidewalls, disposed on the lower-layer insulating-film;
a first protection strip disposed on the lower-layer insulating-film in parallel with the first sidewall of the first resistive layer, implemented by a tandem connection of a plurality of p-n junctions, the tandem connection includes alternate arrangements of a first-polarity zone of a first conductivity type and a second-polarity zone of a second conductivity type;
an interlayer insulating film covering the first resistive layer and the first protection strip;
a first external electrode disposed on the interlayer insulating film, being physically and electrically connected to a terminal of the first resistive layer via a first contact plug and a terminal of the first protection strip via a second contact plug;
an intermediate-connecter disposed on the interlayer insulating film, being physically and electrically connected to another terminal of the first resistive layer via a third contact plug and another terminal of the first protection strip via a fourth contact plug, the intermediate-connecter being ohmically connected to the semiconductor substrate through a window portion of the lower-layer insulating-film; and
a counter electrode disposed on a bottom surface of the semiconductor substrate,
wherein
a resistor is implemented between the first external electrode and the counter electrode, and
the first resistive layer and the first protection strip are electrically connected to each other in parallel.

12. The resistor element of claim 11, wherein
the first protection strip includes a first contact region of the first conductivity type electrically connected to the first external electrode, and a second contact region of the first conductivity type electrically connected to the intermediate-connecter, and
the first-polarity zone and the second-polarity zone are alternately and repeatedly arranged between the first contact region and the second contact region.

13. The resistor element of claim 11, further comprising a counterpart first protection strip of the first protection strip, disposed on the lower-layer insulating-film in parallel with the second sidewall of the first resistive layer, implemented by counterpart tandem connection of a plurality of p-n junctions, the counterpart tandem connection including alternate arrangements of another first-polarity zone of the first conductivity type and another second-polarity zone of the second conductivity type,
wherein the first external electrode is electrically connected to a terminal of the counterpart first protection strip, and the intermediate-connecter is electrically connected to another terminal of the counterpart first protection strip, and
the first resistive layer and the counterpart first protection strip are electrically connected to each other in parallel.

14. The resistor element of claim 11, further comprising:
a second external electrode disposed on the interlayer insulating film;
a rectangular second resistive layer defined by third and fourth sidewalls, disposed on the lower-layer insulating-film, and having a terminal connected to the intermediate-connecter, and another terminal connected to the second external electrode; and
a second protection strip disposed on the lower-layer insulating-film in parallel with the third sidewall of the second resistive layer, implemented by a second tandem connection of a plurality of p-n junctions, the second tandem connection including alternate arrangements of another first-polarity zone of the first conductivity type and another second-polarity zone of the second conductivity type,
wherein
the second resistive layer and the second protection strip are electrically connected to each other in parallel.

15. The resistor element of claim 14, further comprising a counterpart second protection strip of the second protection strip, disposed on the lower-layer insulating-film in parallel with the fourth sidewall of the second resistive layer, implemented by a counterpart second tandem connection of a plurality of p-n junctions, the counterpart second tandem connection including alternate arrangements of a still another first-polarity zone of the first conductivity type and a still another second-polarity zone of the second conductivity type,
wherein
the second resistive layer and the counterpart second protection strip are electrically connected to each other in parallel.

16. The resistor element of claim 11, wherein
the first contact plug is disposed in a first contact hole provided in the interlayer insulating film, between the first resistive layer and the first external electrode, and
the second contact plug is disposed in a second contact hole provided in the interlayer insulating film, between the first protection strip and the first external electrode.

17. The resistor element of claim 11, wherein
the first resistive layer extends, in a width direction of the first resistive layer, between the first external electrode and the intermediate-connecter, and
the first protection strip extends, in the width direction of the first resistive layer, between the first external electrode and the intermediate-connecter.

18. The resistor element of claim 11, wherein
the first protection strip includes a first contact region of the first conductivity type electrically connected to the first external electrode, and a second contact region of the first conductivity type electrically connected to the intermediate-connecter, and the first-polarity zone and the second-polarity zone are alternately and repeatedly arranged between the first contact region and the second contact region,
the semiconductor substrate is of the first conductivity type, and
the first contact region has a higher impurity concentration than the semiconductor substrate.

* * * * *